(12) United States Patent
Mima

(10) Patent No.: US 9,437,834 B2
(45) Date of Patent: Sep. 6, 2016

(54) COATING SYSTEM AND METHOD FOR MANUFACTURING LIGHT-EMITTING DEVICE

(71) Applicant: SUMITOMO CHEMICAL COMPANY, LIMITED, Chuo-ku, Tokyo (JP)

(72) Inventor: Shoji Mima, Ehime (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 28 days.

(21) Appl. No.: 14/390,499

(22) PCT Filed: Apr. 5, 2013

(86) PCT No.: PCT/JP2013/060533
§ 371 (c)(1),
(2) Date: Oct. 3, 2014

(87) PCT Pub. No.: WO2013/151170
PCT Pub. Date: Oct. 10, 2013

(65) Prior Publication Data
US 2015/0093846 A1 Apr. 2, 2015

(30) Foreign Application Priority Data

Apr. 6, 2012 (JP) ................................ 2012-087186

(51) Int. Cl.
*C09D 11/50* (2014.01)
*H01L 51/50* (2006.01)
(Continued)

(52) U.S. Cl.
CPC ........... *H01L 51/5036* (2013.01); *B05B 12/02* (2013.01); *B05B 15/002* (2013.01); *C09D 11/50* (2013.01); *H01L 51/56* (2013.01); *H01L 2251/56* (2013.01)

(58) Field of Classification Search
None
See application file for complete search history.

(56) References Cited

U.S. PATENT DOCUMENTS

2004/0135859 A1* 7/2004 German et al. ................. 347/95
2008/0239027 A1* 10/2008 Kinase et al. ................. 347/85
(Continued)

FOREIGN PATENT DOCUMENTS

CN 101440236 A 5/2009
JP 10-166616 A 6/1998
(Continued)

OTHER PUBLICATIONS

International Search Report for PCT/JP2013/060533 dated Jul. 9, 2013 [PCT/ISA/210].
(Continued)

*Primary Examiner* — Michelle Mandala
*Assistant Examiner* — Tyler Drye
(74) *Attorney, Agent, or Firm* — Sughrue Mion, PLLC

(57) ABSTRACT

Provided is a coating system allowing on-demand preparation and coating of an ink. The coating system (10) includes an ingredient ink supply portion (20), a first pipe (90a), a stirring tank (50) including an ink stirring mechanism (52), a supply regulator portion (30) regulating the respective amounts of ingredient inks supplied to the stirring tank, a controller portion (70) connected to the supply regulator portion through an electric telecommunication line (80), determining a mixing ratio of the ingredient inks, and controlling operation of the supply regulator portion based on the mixing ratio, and a coating device (100) including an ink transport portion (120) connected to the stirring tank and including an ink discharge portion (130).

8 Claims, 6 Drawing Sheets

(51) Int. Cl.
    *B05B 12/02*     (2006.01)
    *B05B 15/00*     (2006.01)
    *H01L 51/56*     (2006.01)

(56)     References Cited

U.S. PATENT DOCUMENTS

2009/0309094 A1*  12/2009  Frey et al. .................. 257/40
2010/0261109 A1*  10/2010  Okada et al. ............... 430/105
2011/0115844 A1*   5/2011  Ozawa ........................ 347/28

FOREIGN PATENT DOCUMENTS

| | | |
|---|---|---|
| JP | 10-168368 A | 6/1998 |
| JP | 2008-6397 A | 1/2008 |
| JP | 2009-528400 A | 8/2009 |
| JP | 2010-45222 A | 2/2010 |
| JP | 2010-108927 A | 5/2010 |

OTHER PUBLICATIONS

First Office Action issued Dec. 2, 2015 in corresponding Chinese Patent Application No. 201380018875.8 with translation.

* cited by examiner

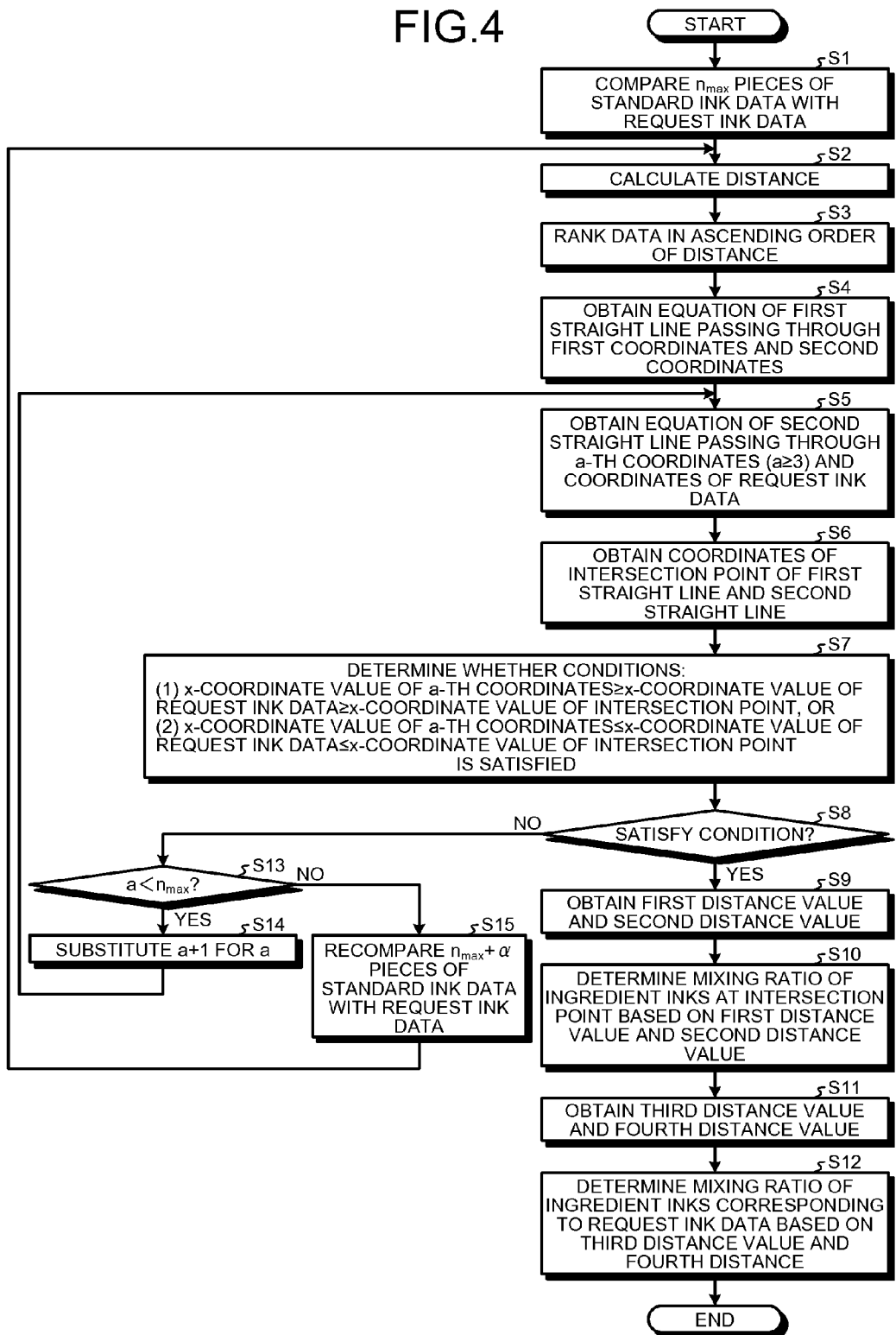

COATING SYSTEM AND METHOD FOR MANUFACTURING LIGHT-EMITTING DEVICE

CROSS REFERENCE TO RELATED APPLICATIONS

This application is a National Stage of International Application No. PCT/JP2013/060533, filed on Apr. 5, 2013, which claims priority from Japanese Patent Application No. 2012-087186, filed on Apr. 6, 2012, the contents of all of which are incorporated herein by reference in their entirety.

TECHNICAL FIELD

The present invention relates to a coating system and a method for manufacturing a light-emitting device using the coating system.

BACKGROUND ART

Light-emitting devices (organic electroluminescent elements) mainly comprise an anode, a cathode, and a light-emitting layer disposed between the anode and the cathode. The light-emitting layer contains a light-emitting material that is an organic compound and emits light by application of voltage across the anode and the cathode.

The organic electroluminescent elements are required to have a wide variety of light-emitting colors as the application fields has been expanding, and light-emitting materials having various light-emitting colors have been developed.

For example, to form a light-emitting layer having a prescribed light-emitting color by a coating method, a technique has been disclosed. The technique uses a light-emitting composite material prepared by mixing three light-emitting materials (light emissive polymers) each having a different light-emitting color at an adjusted mixing ratio (for example, see Patent Document 1).

RELATED ART DOCUMENTS

Patent Document
Patent Document 1: JP 2009-528400 A

DISCLOSURE OF INVENTION

Problem to be Solved by the Invention

In the technique disclosed in Patent Document 1, however, a light-emitting color is adjusted by merely mixing three powders each containing a light-emitting material having a different light-emitting color. Therefore, for example, individual formation of a plurality of light-emitting layers each having a different light-emitting color in a single organic electroluminescent element or continuous manufacturing of various types of organic electroluminescent elements necessitates complicated steps such as preparation of various inks corresponding to a plurality of light-emitting colors in advance and replacement of tanks storing respective inks at an appropriate timing.

In view of the above, the present invention has an object to provide a coating system that eliminates complicated steps such as preparation of a plurality of inks in advance and replacement of tanks storing respective inks at an appropriate timing and that allows on-demand preparation and coating of an ink having a desired light-emitting color and to provide a coating method using the coating system.

Means for Solving Problem

The present invention provides [1] to [9] below.
[1] A coating system comprising:
an ingredient ink supply portion supplying ingredient inks used in a coating method, each of the ingredient inks being a coating liquid that contains a light-emitting material being an organic compound;
a first pipe connected to the ingredient ink supply portion;
a stirring tank comprising an ink stirring mechanism and connected to the ingredient ink supply portion through the first pipe
a supply regulator portion provided on the first pipe and regulating the respective amounts of the ingredient inks supplied to the stirring tank;
a controller portion connected to the supply regulator portion through an electric telecommunication line, determining a mixing ratio of the ingredient inks, and controlling operation of the supply regulator portion based on the mixing ratio; and
a coating device comprising an ink transport portion connected to the stirring tank through a second pipe and comprising an ink discharge portion connected to the ink transport portion through a third pipe.
[2] The coating system according to claim 1, wherein the supply regulator portion comprises a flow measurement portion provided on the first pipe and connected to the controller portion through the electric telecommunication line and comprises a regulator portion provided on the first pipe and connected to the controller portion through the electric telecommunication line.
[3] The coating system according to above [1], wherein the supply regulator portion comprises a front valve provided on the first pipe and connected to the controller portion through the electric telecommunication line, a diaphragm metering pump provided on the first pipe and connected to the controller portion through the electric telecommunication line, and a rear valve connected to the controller portion through the electric telecommunication line.
[4] The coating system according to any one of above [1] to [3], further comprising a washing portion that comprises a washing solution supply portion connected to the stirring tank through a washing solution supply pipe and comprises an inert gas supply portion connected to the stirring tank through an inert gas supply pipe.
[5] The coating system according to any one of above [1] to [4], wherein a coating method performed by the coating device is a spin coating method, a slit die method, a spraying method, or a capillary coating method.
[6] A method for manufacturing a light-emitting device using the coating system according to any one of above [1] to [5], the method comprising the steps of:
receiving request ink data at the controller portion;
receiving a standard ink data set and determining a mixing ratio of a plurality of ingredient inks based on the standard ink data set and the request ink data at the controller portion;
determining the amounts of the ingredient inks supplied to the stirring tank based on the determined mixing ratio at the controller portion;
determining operation of the supply regulator portion for supplying the respective ingredient inks in the determined amounts and outputting a setup signal for performing the operation from an output portion, at the controller portion;
supplying the respective ingredient inks in the determined amounts into the stirring tank based on the input setup signal at the supply regulator portion;
stirring the supplied ingredient inks with the ink stirring mechanism provided in the stirring tank to prepare a mixed ink for coating; and
applying the prepared mixed ink onto an object.

[7] The method for manufacturing a light-emitting device according to above [6], wherein the step of determining a mixing ratio of a plurality of the ingredient inks comprises:
comparing the standard ink data set comprising three or more standard ink data with the request ink data at the controller portion;
calculating distances between coordinates in chromaticity coordinates of the respective standard ink data and coordinates in chromaticity coordinates of the request ink data to obtain distance data set at the controller portion;
ranking the distance data set and the corresponding standard ink data set in ascending order of the distance based on the obtained distance data set at the controller portion;
obtaining an equation of a first straight line passing through first coordinates of the first place and second coordinates of the second place in the ranking at the controller portion;
determining a-th coordinates corresponding to an a-th place in the ranking, the a-th place being highest except the first coordinates and the second coordinates in the standard ink data set, such that the coordinates of the request ink data are comprised in an area surrounded by straight lines passing through the first coordinates, the second coordinates, and the a-th coordinates, at the controller portion;
obtaining an equation of a second straight line passing through the a-th coordinates thus determined and the coordinates of the request ink data at the controller portion;
obtaining coordinates of an intersection point of the first straight line and the second straight line at the controller portion;
determining whether at least one of conditions (1) and (2) is satisfied at the controller portion:
(1) x-coordinate value of the a-th coordinates ≥x-coordinate value of the request ink data ≥x-coordinate value of the intersection point, and
(2) x-coordinate value of the a-th coordinates ≤x-coordinate value of the request ink data ≤x-coordinate value of the intersection point;
obtaining a first distance value from the first coordinates to the coordinates of the intersection point and a second distance value from the second coordinates to the coordinates of the intersection point at the controller portion;
determining the mixing ratio of the ingredient inks at the intersection point based on the first distance value and the second distance value at the controller portion;
obtaining a third distance value from the a-th coordinates to the coordinates of the request ink data and a fourth distance value from the coordinates of the request ink data to the coordinates of the intersection point at the controller portion; and
determining the mixing ratio of the ingredient inks for the request ink data based on the third distance value and the fourth distance value at the controller portion.

[8] The method for manufacturing a light-emitting device according to above [6] or [7], wherein the step of applying the mixed ink onto the object is performed by a spin coating method, a slit die method, a spraying method, or a capillary coating method.

[9] The method for manufacturing a light-emitting device according to any one of above [6] to [8], wherein a plurality of mixed inks are applied and a plurality of light-emitting devices having a plurality of light-emitting colors are continuously manufactured.

Effect of the Invention

The present invention provides a coating system allowing on-demand preparation and coating of an ink having a desired light-emitting color and a method for manufacturing a light-emitting device using the coating system.

BRIEF DESCRIPTION OF DRAWINGS

FIG. 3-1 is a functional block diagram of a supply regulator portion comprised in the coating system.
FIG. 3-2 is a functional block diagram of a controller portion comprised in the coating system.
FIG. 4 is a flowchart for describing a method for manufacturing a light-emitting device using the coating system.

DESCRIPTION OF EMBODIMENTS

Embodiments of the present invention will now be described with reference to the accompanying drawings. Each drawing schematically illustrates the shapes, the sizes, and the arrangements of components to such a degree that the invention can be understood. The present invention is not intended to be limited by the below descriptions, and each component can be appropriately modified without departing from the scope of the present invention. In each drawing used for the below descriptions, similar components are indicated by the same reference sign, and a redundant description thereof may be omitted.

1. Coating System

Figure 1:
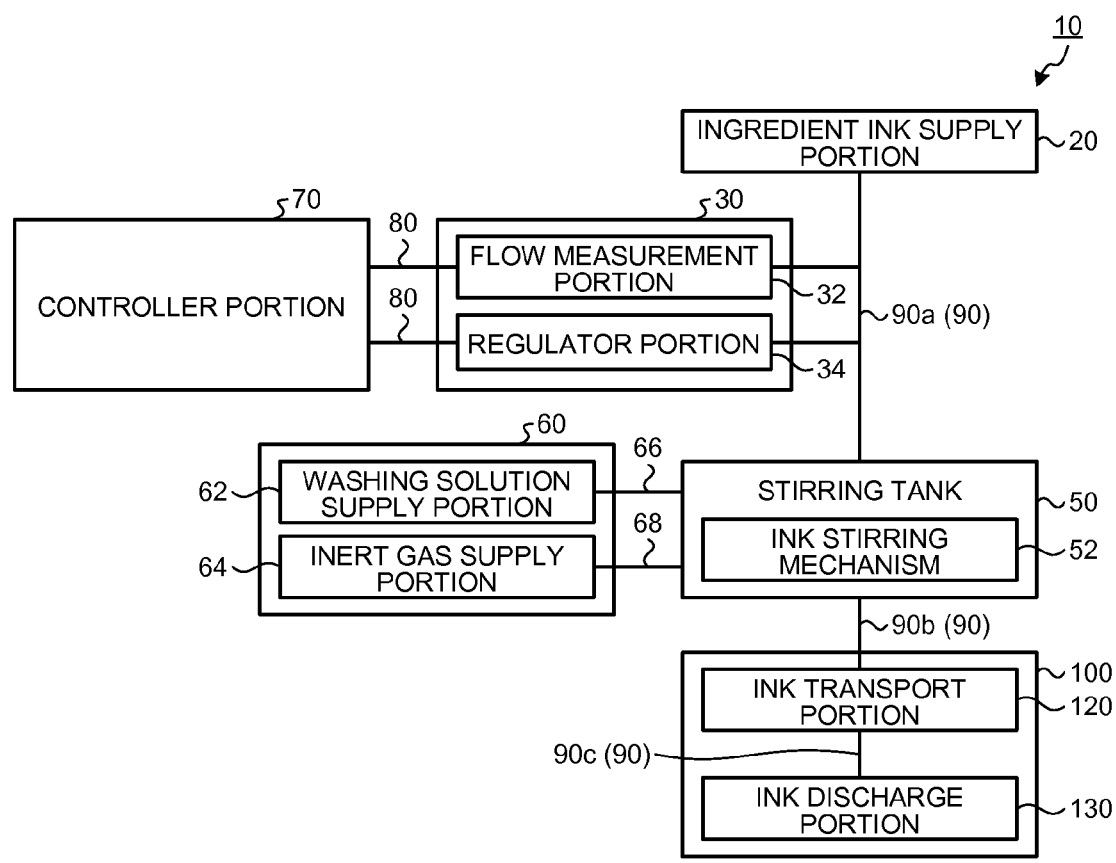
FIG. 1 is a functional block diagram of a coating system.

With reference to FIG. 1, a configuration example of a coating system pertaining to an embodiment of the present invention will be described. FIG. 1 is a functional block diagram of the coating system.

As illustrated in FIG. 1, a coating system 10 comprises an ingredient ink supply portion 20, a first pipe 90a connected to the ingredient ink supply portion 20, a stirring tank 50 comprising an ink stirring mechanism 52 and connected to the ingredient ink supply portion 20 through the first pipe 90a, a supply regulator portion 30 provided on the first pipe 90a and regulating the respective amounts of ingredient inks supplied to the stirring tank 50, a controller portion 70 connected to the supply regulator portion 30 through an electric telecommunication line 80, determining a mixing ratio of the ingredient inks, and controlling operation of the supply regulator portion 30 based on the mixing ratio, and a coating device 100 comprising an ink transport portion 120 connected to the stirring tank 50 through a second pipe 90b and comprising an ink discharge portion 130 connected to the ink transport portion 120 through a third pipe 90c.

The "ingredient ink" is a coating liquid that is used in a coating method and contains a light-emitting material of an organic compound and is such an ink that a light-emitting color of an organic electroluminescent element comprising a light-emitting layer formed by using the coating liquid is specified by the International Commission on Illumination (CIE) 1931 chromaticity coordinates (hereinafter, simply referred to as "chromaticity coordinates").

The coating system 10 can use two or more ingredient inks to perform a coating step. The coating system 10 preferably uses three ingredient inks having respective different light-emitting colors (for example, a red light-emitting color, a green light-emitting color, and a blue light-emitting color) because a wide range of light-emitting colors can be reproduced. To expand the reproduction range of light-emitting colors, four or more ingredient inks having respective different light-emitting colors (for example, a red light-emitting color, a green light-emitting color, a blue light-emitting color, and a yellow light-emitting color) may be used.

Figure 2:
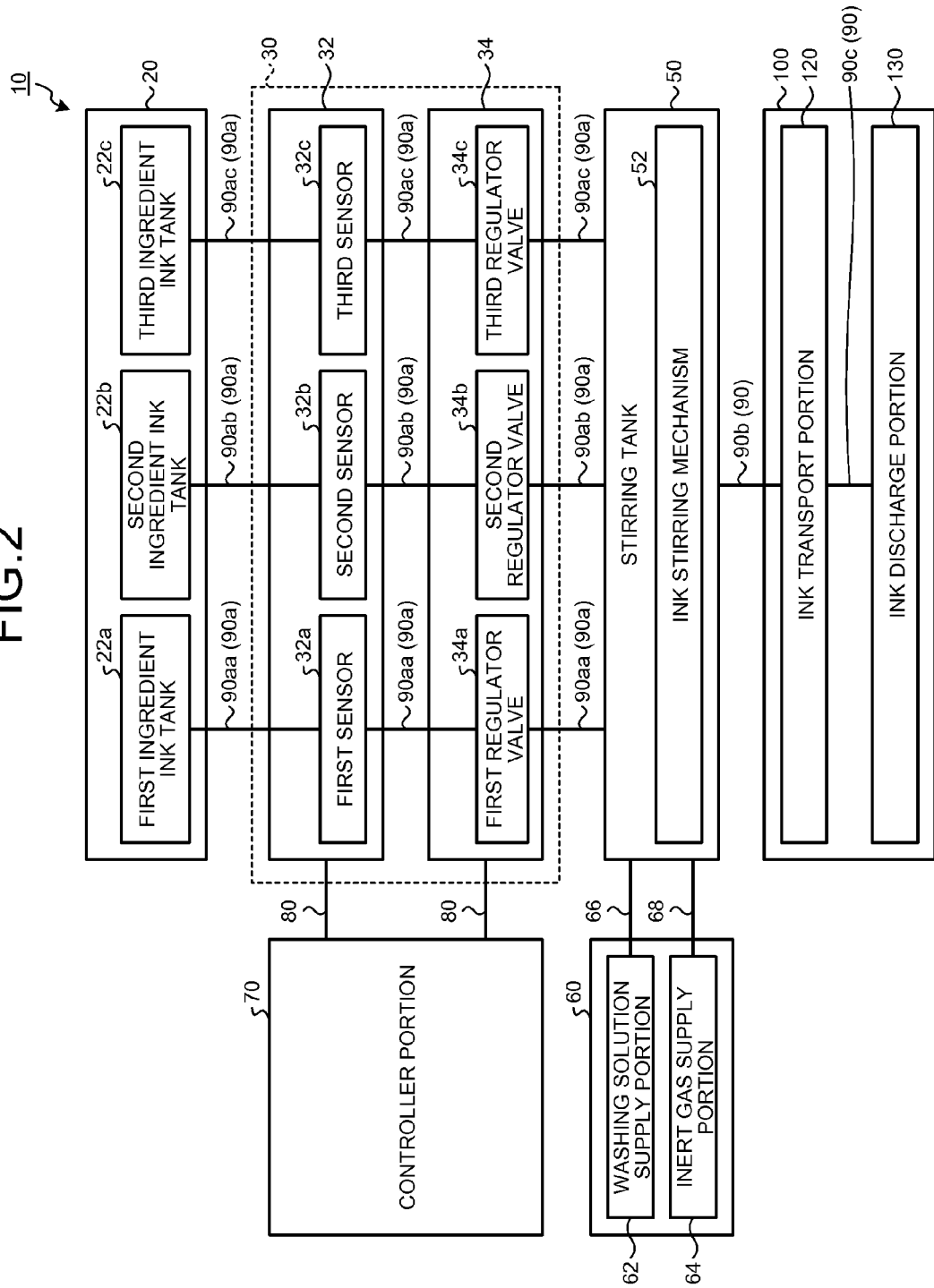
FIG. 2 is a view illustrating a configuration example of the coating system.

With reference to FIG. 2, a specific configuration example of the coating system 10 using three ingredient inks will be described. FIG. 2 is a view illustrating a configuration example of the coating system.

As illustrated in FIG. 2, the coating system 10 in the configuration example comprises an ingredient ink supply portion 20 capable of supplying three kinds of ingredient inks. The ink supply portion 20 comprises a first ingredient ink tank 22a for storing a first ingredient ink, a second ingredient ink tank 22b for storing a second ingredient ink, and a third ingredient ink tank 22c for storing a third ingredient ink.

The coating system 10 comprises a first pipe 90a connected to the ingredient ink supply portion 20 at one end side. The first pipe 90a comprises a first pipe portion 90aa connected to the first ingredient ink tank 22a at one end side, a second pipe portion 90ab connected to the second ingredient ink tank 22b at one end side, and a third pipe portion 90ac connected to the third ingredient ink tank 22c at one end side.

The other end side of the first pipe 90a is connected to a stirring tank 50. On the first pipe 90a, a supply regulator portion 30 comprising a flow measurement portion 32 and a regulator portion 34 is provided. In the configuration example illustrated in FIG. 2, the flow measurement portion 32 is provided closer to the ingredient ink supply portion 20 than the regulator portion 34 (hereinafter, in terms of the flow direction of an ingredient ink, a "closer side to the ingredient ink supply portion 20" is also referred to as an "upstream side", and a "closer side to the stirring tank 50" is also referred to as a "downstream side").

In the configuration example illustrated in FIG. 2, the flow measurement portion 32 comprises a first sensor 32a provided on the first pipe portion 90aa, a second sensor 32b provided on the second pipe portion 90ab, and a third sensor 32c provided on the third pipe portion 90ac.

The regulator portion 34 comprises a first regulator valve 34a provided on the first pipe portion 90aa, a second regulator valve 34b provided on the second pipe portion 90ab, and a third regulator valve 34c provided on the third pipe portion 90ac.

The stirring tank 50 comprises an ink stirring mechanism 52 in the inside of the tank. To the stirring tank 50, one end side of a second pipe 90b is connected. To the other end side of the second pipe 90b, a coating device 100 is connected. The coating device 100 comprises an ink transport portion 120, a third pipe 90c connected to the ink transport portion 120 at one end side, and an ink discharge portion 130 connected to the other end side of the third pipe 90c.

Figures 1, 3:
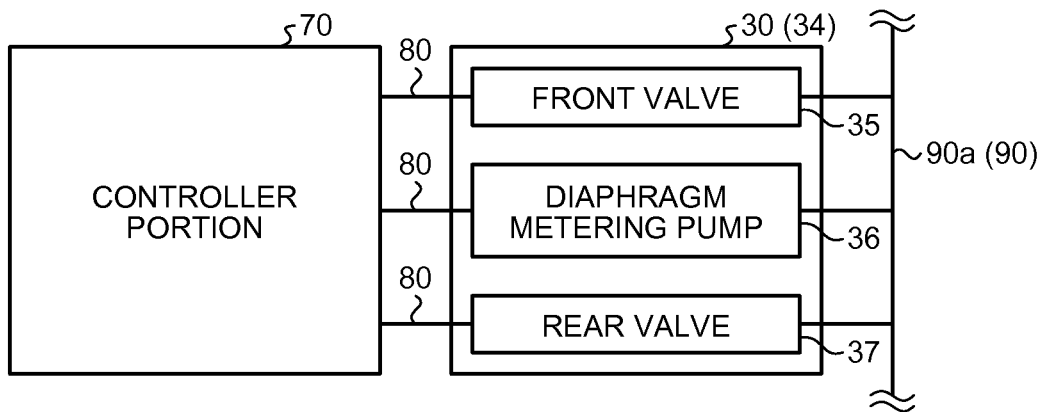
Figures 2, 3:
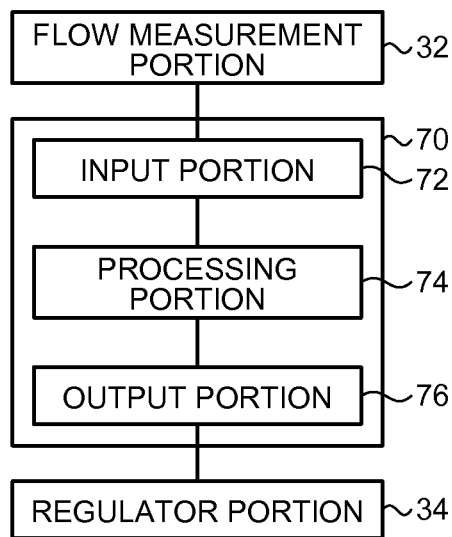

With reference to FIG. 1, FIG. 2, FIG. 3-1, and FIG. 3-2, the above described components of the coating system 10 will be described in detail.

<Ingredient Ink Supply Portion>

The ingredient ink supply portion 20 (the first ingredient ink tank 22a, the second ingredient ink tank 22b, and the third ingredient ink tank 22c) has a function of supplying a plurality of ingredient inks to the stirring tank 50.

Each of the first ingredient ink tank 22a, the second ingredient ink tank 22b, and the third ingredient ink tank 22c is preferably configured as an airtight container. The constituent material of each of the first ingredient ink tank 22a, the second ingredient ink tank 22b, and the third ingredient ink tank 22c can be selected from any appropriate materials under such conditions that the constituent material is not degraded by ingredient inks and contains no component to be eluted into ingredient inks.

Each of the first ingredient ink tank 22a, the second ingredient ink tank 22b, and the third ingredient ink tank 22c is preferably configured to be detachable and replaceable with another ingredient ink tank storing a different ingredient ink.

The first ingredient ink tank 22a, the second ingredient ink tank 22b, and the third ingredient ink tank 22c store respective ingredient inks having different light-emitting colors with each other.

Each of the first ingredient ink tank 22a, the second ingredient ink tank 22b, and the third ingredient ink tank 22c preferably has an ingredient ink delivery mechanism for delivering an ingredient ink to out of the tank. Examples of the ingredient ink delivery mechanism may include a mechanism of supplying air or an inert gas such as a nitrogen gas into each of the first ingredient ink tank 22a, the second ingredient ink tank 22b, and the third ingredient ink tank 22c, pressurizing the surface of an ingredient ink (liquid surface) to force down the surface of the ingredient ink, and thus allowing delivery of the ingredient ink to the first pipe 90a.

<Pipe>

The first pipe 90a (the first pipe portion 90aa, the second pipe portion 90ab, and the third pipe portion 90ac), the second pipe 90b, and the third pipe 90c (also generically referred to as pipe 90) work as routes for transporting the ingredient inks stored in the supply portion 20. The first pipe 90a works as a route for supplying the ingredient ink delivered from the ingredient ink supply portion 20 to the stirring tank 50. The second pipe 90b works as a passage for supplying the mixed ink delivered from the stirring tank 50 to the coating device 100. The third pipe 90c works as a passage for supplying the mixed ink from the ink transport portion 120 to the ink discharge portion 130.

As the pipe 90, a tubular body (pipe) made of an appropriate material usable for conventional coating devices, such as polytetrafluoroethylene and stainless steel under such conditions that the material is not degraded by ingredient inks or an ink (also referred to as mixed ink) prepared by mixing a plurality of ingredient inks and used in a coating step and contains no component to be eluted into ingredient inks or a mixed ink, can be used.

<Stirring Tank>

The stirring tank 50 is connected to the ingredient ink supply portion 20 through the first pipe 90a. The stirring tank 50 has functions capable of mixing a predetermined amount of a first ingredient ink supplied from the first ingredient ink tank 22a, a predetermined amount of a second ingredient ink supplied from the second ingredient ink tank 22b, and a predetermined amount of a third ingredient ink supplied from the third ingredient ink tank 22c to prepare a mixed ink having a desired light-emitting color and capable of storing the prepared mixed ink. The material constituting the stirring tank 50 may be an appropriately shaped container made of an appropriate material such as stainless steel under such conditions that the material is not degraded by ingredient inks or a mixed ink and contains no component to be eluted into ingredient inks or a mixed ink. For example, the material, the shape, and the volume of the stirring tank 50 may be appropriately designed depending on an intended embodiment.

The stirring tank 50 comprises an ink stirring mechanism 52. The ink stirring mechanism 52 has a function capable of stirring and mixing a plurality of ingredient inks supplied in the stirring tank 50 to make the mixed ink.

Examples of the ink stirring mechanism 52 may include (1) a mechanism (for example, a propeller stirring type apparatus) comprising propellers (wing-like plates) in the stirring tank 50 and rotating the propellers in a liquid layer of the ingredient inks supplied into the stirring tank 50, (2) a mechanism (for example, an ultrasonic generator) capable of applying minute vibrations such as ultrasonic waves to a liquid layer of the ingredient inks supplied into the stirring tank 50, and (3) a mechanism (for example, a circulation pump and a pipe) capable of circulating the ingredient inks supplied into the stirring tank 50 in the stirring tank 50 and generating streaming in the stirring tank 50.

As another example, the stirring tank 50 may be configured to have a tubular shape through which the ingredient inks flow, and unevenness is provided on the tubular inside (passage) of the stirring tank 50 itself so as to generate a vortex flow of the ingredient inks. In this case, the stirring tank 50 itself also serves as the ink stirring mechanism 52.

<Washing Portion>

The coating system 10 comprises a washing portion 60. The washing portion 60 has a function of washing and drying the inside of the stirring tank 50 when the mixing ratio of the ingredient inks is changed or when the kind of the ingredient ink is changed.

The washing portion 60 comprises a washing solution supply portion 62 connected to the stirring tank 50 through a washing solution supply pipe 66 and an inert gas supply portion 64 connected to the stirring tank 50 through an inert gas supply pipe 68.

The washing solution supply portion 62 has a function of supplying a washing solution to the stirring tank 50. The washing solution supply portion 62 can be composed of a tank capable of storing the washing solution and a commercially available pump capable of supplying the washing solution from the tank to the stirring tank 50, for example.

The washing solution may be a solvent capable of dissolving or dispersing solutes contained in the ingredient inks and the mixed ink supplied to the stirring tank 50. The solvent usable as the washing solution is preferably capable of dissolving or dispersing solid contents in the ingredient inks and the mixed ink and is preferably miscible with solvents in the ingredient inks. The washing solution may be a solvent used in the ingredient ink or the mixed ink. The washing solution can be appropriately selected in consideration of the above conditions. Examples of the washing solution may include organic solvents such as tetrahydrofuran, xylene, and toluene and mixed solvents containing one or more of these organic solvents.

The inert gas supply portion 64 has a function of supplying an inert gas for drying the inside of the stirring tank 50 after washing. The inert gas can be appropriately selected in consideration of components in the ingredient inks and the mixed ink to be used. Examples of the inert gas supplied from the inert gas supply portion 64 may include an argon gas and a nitrogen gas. Air may also be used as the inert gas.

The washing solution supply pipe 66 and the inert gas supply pipe 68 may be tubular bodies made of an appropriate material such as stainless steel under such conditions that the material is not degraded by a solvent or an inert gas to be supplied.

<Supply Regulator Portion>

The supply regulator portion 30 is provided on the first pipe 90a. In other words, the supply regulator portion 30 is disposed on the passage of the ingredient ink from the ingredient ink tank 20 to the stirring tank 50. The supply regulator portion 30 has a function capable of regulating the amount of the ingredient ink supplied to the stirring tank 50. The supply regulator portion 30 can independently regulate the respective amounts of the ingredient inks supplied to the stirring tank 50 through the first pipe portion 90aa, the second pipe portion 90ab, and the third pipe portion 90ac. The supply regulator portion 30 comprises a flow measurement portion 32 and a regulator portion 34, for example.

The flow measurement portion 32 has a function capable of measuring the respective amounts of the ingredient inks passing through the first pipe 90a (the first pipe portion 90aa, the second pipe portion 90ab, and the third pipe portion 90ac). The flow measurement portion 32 can be various commercially available flow sensors. Examples of such a flow sensor may include Coriolis flow sensors and thermal diffusion flow sensors.

The regulator portion 34 has a function capable of variably regulating the flow rate of the ingredient ink in response to a request. This can regulate the respective amounts of the ingredient inks passing through the first pipe 90a. The regulator portion 34 can be various types of flow valves such as commercially available electromagnetic valves and air-operated valves under such conditions that the valve can variably regulate the flow rate in response to a request.

As the supply regulator portion 30, a mass flow controller that is integrally composed of the flow measurement portion 32 and the regulator portion 34, for example, can be used. The mass flow controller is preferably a mass flow controller that is integrally composed of a flow sensor corresponding to the flow measurement portion 32 and a flow regulating valve corresponding to the regulator portion 34 and that has a function capable of comparing the measured value determined by the flow sensor with the prescribed flow rate value, then automatically regulating the opening and closing of the flow regulating valve so that these values become equal, and thus regulating the flow rate, for example. Such a mass flow controller can be commercially available various mass flow controllers.

With reference to FIG. 3-1, another configuration example of the supply regulator portion 30 will be described.

FIG. 3-1 is a functional block diagram of the supply regulator portion used in the coating system.

As illustrated in FIG. 3-1, the supply regulator portion 30 comprises a front valve 35 provided on the uppermost stream side, a diaphragm metering pump 36 provided on the downstream side from the front valve 35, and a rear valve 37 provided on the downstream side from the diaphragm metering pump 36. The front valve 35, the diaphragm metering pump 36, and the rear valve 37 are integrated to correspond to the supply regulator portion 30.

Each of the front valve 35, the diaphragm metering pump 36, and the rear valve 37 is provided on the first pipe 90a. To apply the configuration to the configuration example illustrated in FIG. 2, the front valve 35, the diaphragm metering pump 36, and the rear valve 37 are provide on each of the first pipe portion 90aa, the second pipe portion 90ab, and the third pipe portion 90ac.

The front valve 35 and the rear valve 37 are configured to regulate the degree of opening or to close the passage and thus have a function capable of regulating the flow of the ingredient ink or capable of stopping the flow of the ingredient ink. Valves having various configurations are commercially available as such a valve.

The diaphragm metering pump 36 has a function capable of measuring a predetermined amount of the ingredient ink from the ingredient ink passing through the first pipe 90a and of supplying the measured ingredient ink to the stirring tank 50. Examples of such a diaphragm metering pump may include a rolling diaphragm pump described in JP 2007-23935 A.

<Controller Portion>

With reference to FIG. 3-2, a configuration example of the controller portion 70 will be described. FIG. 3-2 is a functional block diagram of the controller portion used in the coating system.

The controller portion 70 is connected to the supply regulator portion 30 comprising the flow measurement portion 32 (the first sensor 32a, the second sensor 32b, and the third sensor 32c) provided on the first pipe 90a and the regulator portion 34 (the first regulator valve 34a, the second regulator valve 34b, and the third regulator valve 34c) provided on the first pipe 90a through respective electric telecommunication lines 80.

As illustrated in FIG. 3-2, the controller portion 70 comprises an input portion 72 connected to the flow measurement portion 32, an processing portion 74 connected to the input portion 72, and an output portion 76 connected to the processing portion 74 and also connected to the regulator portion 34.

The controller portion 70 is configured to be capable of independently regulating each operation of the flow measurement portion 32 (the first sensor 32a, the second sensor 32b, and the third sensor 32c), the regulator portion 34 (the first regulator valve 34a, the second regulator valve 34b, and the third regulator valve 34c), the front valve 35, the diaphragm metering pump 36, and the rear valve 37 through the respective electric telecommunication lines 80.

The controller portion 70 is configured to be capable of regulating the function of the supply regulator portion 30 connected through the electric telecommunication lines 80. The controller portion 70 can be achieved by a computer hardware equipped with, for example, a microprocessor corresponding to the processing portion 74 and interfaces such as serial interfaces and parallel interfaces corresponding to the input portion 72 and the output portion 76.

The electric telecommunication line 80 is a wired or wireless information line through a medium such as electricity and optical media and has a function and configuration capable of exchanging control signals between the controller portion 70 and the supply regulator portion 30.

<Coating Device>

The coating system 10 comprises a coating device 100. The coating device 100 is connected to the stirring tank 50 through a second pipe 90b. The coating system 100 has functions of receiving the mixed ink from the stirring tank 50 and applying the ink onto an object such as a substrate to form a film.

The coating device 100 comprises an ink transport portion 120 and an ink discharge portion 130. The ink transport portion 120 is connected to the second pipe 90b and has a function of transporting the mixed ink stored in the stirring tank 50. The ink transport portion 120 can be selected from commercially available pumps having various configurations.

The ink discharge portion 130 is connected to the ink transport portion 120 through a third pipe 90c and has a function of discharging the mixed ink supplied from the ink transport portion 120 to apply the mixed ink onto the object. The ink discharge portion 130 is a function portion corresponding to a nozzle discharging an ink and has various configurations depending on a selected coating method.

The coating device 100 can be a coating device capable of performing a coating step by an appropriate coating method. Examples of the coating method performed by the coating device 100 may include a spin coating method, a slit die method, a spraying method, and a capillary coating method.

2. Method for Manufacturing Light-Emitting Device

With reference to FIG. 4, FIG. 5, FIG. 6, FIG. 7, and FIG. 8, a method for manufacturing a light-emitting device using the coating system 10 will be described.

Figure 5:
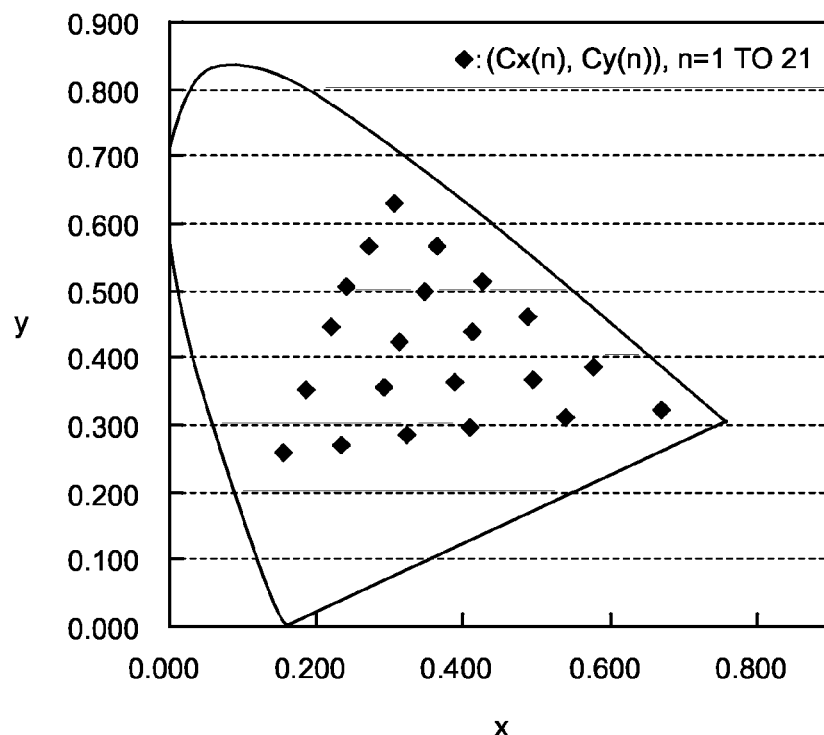
FIG. 5 is a FIG. 1) illustrating an example of chromaticity coordinates for determining a mixing ratio of ingredient inks.
Figure 6:
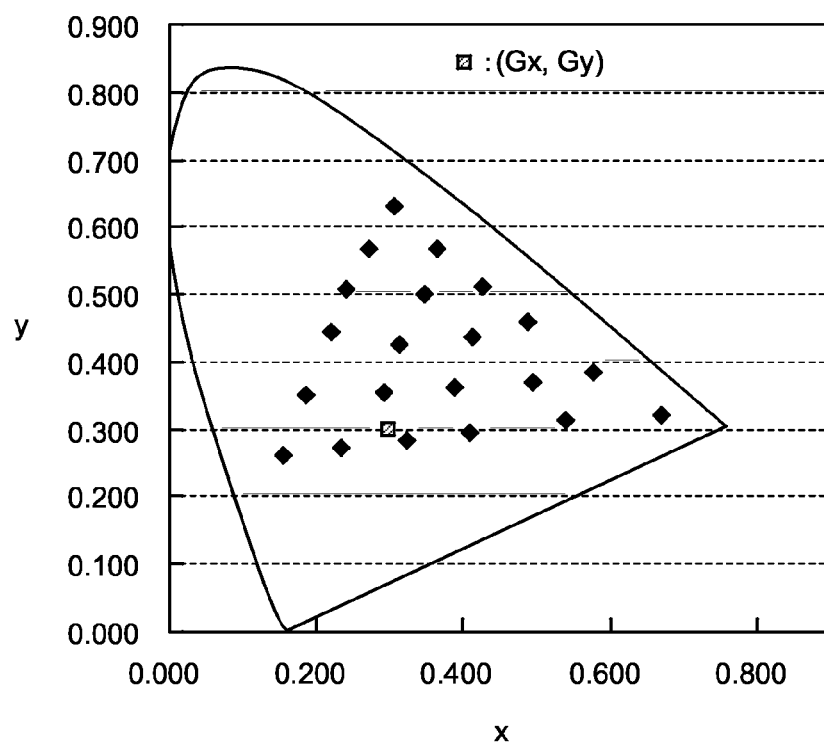
FIG. 6 is a FIG. 2) illustrating an example of chromaticity coordinates for determining a mixing ratio of ingredient inks.
Figure 7:
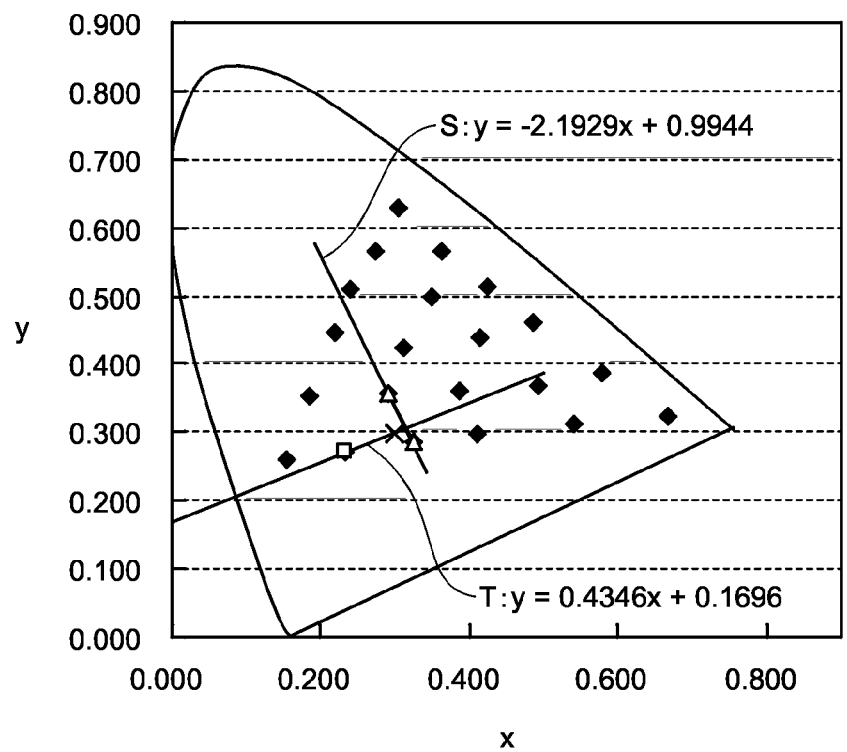
FIG. 7 is a FIG. 3) illustrating an example of chromaticity coordinates for determining a mixing ratio of ingredient inks.
Figure 8:
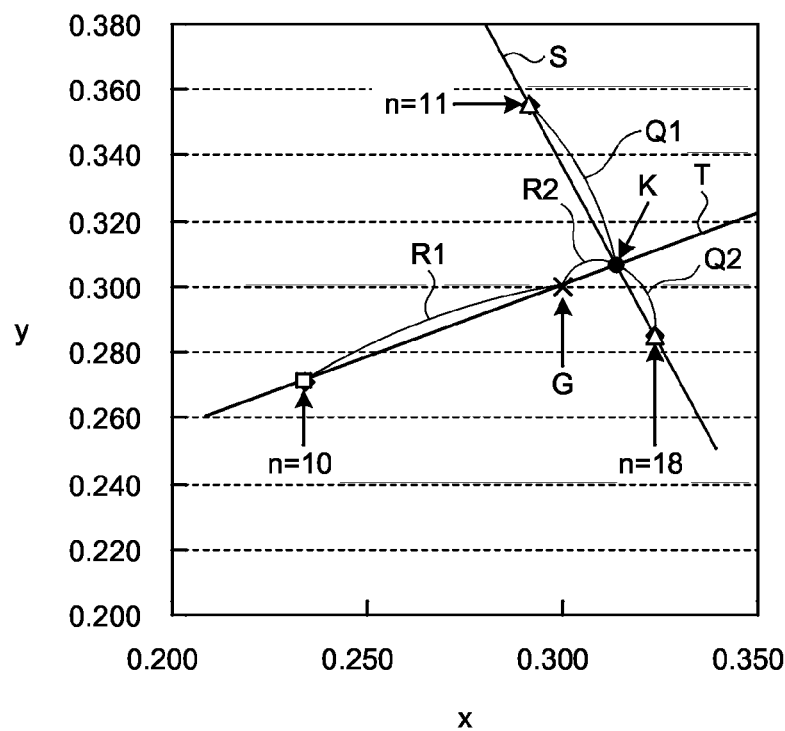
FIG. 8 is a schematic graph for describing the step of determining a mixing ratio of ingredient inks.

FIG. 4 is a flowchart for describing the method for manufacturing a light-emitting device. FIG. 5 is a FIG. 1) illustrating an example of chromaticity coordinates for determining a mixing ratio of ingredient inks. FIG. 6 is a FIG. 2) illustrating an example of chromaticity coordinates for determining a mixing ratio of ingredient inks. FIG. 7 is a FIG. 3) illustrating an example of chromaticity coordinates for determining a mixing ratio of ingredient inks. FIG. 8 is a schematic graph prepared by extracting and enlarging the main section in FIG. 7 for describing the step of determining a mixing ratio of ingredient inks.

The method for manufacturing a light-emitting device using the coating system 10 comprises receiving request ink data at the controller portion 70; receiving a standard ink data set and determining a mixing ratio of a plurality of ingredient inks based on the standard ink data set and the request ink data at the controller portion 70; determining the amounts of the ingredient inks supplied to the stirring tank 50 based on the determined mixing ratio at the controller portion 70; determining operation of the supply regulator portion 30 for supplying the respective ingredient inks in the determined amounts and outputting a setup signal for performing the operation from an output portion 76, at the controller portion 70; supplying the respective ingredient inks in the determined amounts into the stirring tank 50 based on the input setup signal at the supply regulator portion 30; stirring the supplied ingredient inks with the ink stirring mechanism 52 provided in the stirring tank 50 to prepare a mixed ink for coating; and applying the prepared mixed ink onto the object.

The coating system 10 is used in the step of forming a light-emitting layer by applying a mixed ink. Thus, the step of forming a light-emitting layer using the coating system 10, that is, the coating step comprising preparation of a mixed ink using the coating system 10 will be described with reference to specific examples.

The examples used in the below description are merely specific examples, and the present invention is not intended to be limited to these examples.

<Step of Collecting Standard Ink Data>

To perform the step of forming a light-emitting layer, standard ink data of known mixed inks are collected in advance. The standard ink data is the correlation between a mixing ratio (referred to as P (m, n)) of prescribed ingredient inks in terms of weight ratio (% by weight concentration) and a chromaticity C, that is, coordinates C (referred to as (Cx (n), Cy (n))) in the chromaticity coordinates of the light-emitting color. The collected standard ink data is generically referred to as a standard ink data set.

n is an integer of 1 or more and is a consecutive number uniquely assigned to each standard ink data. A maximum value of n corresponds to the total number of the standard ink data. In the below description, the total number of the standard ink data is referred to as $n_{max}$. m is a consecutive number uniquely assigned to each ingredient ink.

An example in which the total number of the standard ink data constituting a standard ink data set is 21, and three ingredient inks, an ingredient ink 1 having a light-emitting color of blue, an ingredient ink 2 having a light-emitting color of green, and an ingredient ink 3 having a light-emitting color of red are used as the ingredient inks, that is, the maximum value $n_{max}$ of n is 21, and the maximum value of m is 3 will be described below. A specific example of the collected standard ink data is listed in Table 1 and FIG. 5.

TABLE 1

| | mixing ratio of the ingredient inks P(m, n) (weight ratio) | | | | |
|---|---|---|---|---|---|
| | ingredient ink 1 m = 1 (% by | ingredient ink 2 m = 2 (% by | ingredient ink 3 m = 3 (% by | chromaticity C | |
| n | weight) | weight) | weight) | Cx(n) | Cy(n) |
| 1 | 100.00 | 0.00 | 0.00 | 0.155 | 0.260 |
| 2 | 0.00 | 100.00 | 0.00 | 0.306 | 0.630 |
| 3 | 0.00 | 0.00 | 100.00 | 0.668 | 0.323 |
| 4 | 95.20 | 4.80 | 0.00 | 0.220 | 0.445 |
| 5 | 94.40 | 0.00 | 5.60 | 0.410 | 0.296 |
| 6 | 0.00 | 75.00 | 25.00 | 0.487 | 0.460 |
| 7 | 98.20 | 1.80 | 0.00 | 0.185 | 0.353 |
| 8 | 72.00 | 28.00 | 0.00 | 0.241 | 0.508 |
| 9 | 37.00 | 63.00 | 0.00 | 0.273 | 0.567 |
| 10 | 98.60 | 0.00 | 1.40 | 0.234 | 0.271 |
| 11 | 96.70 | 0.00 | 3.30 | 0.324 | 0.285 |
| 12 | 88.70 | 0.00 | 11.30 | 0.539 | 0.312 |
| 13 | 0.00 | 92.20 | 7.80 | 0.363 | 0.566 |
| 14 | 0.00 | 84.50 | 15.50 | 0.425 | 0.512 |
| 15 | 0.00 | 53.70 | 46.30 | 0.578 | 0.386 |
| 16 | 47.87 | 49.83 | 2.30 | 0.348 | 0.499 |
| 17 | 93.19 | 5.01 | 1.80 | 0.312 | 0.425 |
| 18 | 96.04 | 2.06 | 1.90 | 0.291 | 0.355 |
| 19 | 65.29 | 30.31 | 4.40 | 0.413 | 0.438 |
| 20 | 91.95 | 2.65 | 5.40 | 0.388 | 0.363 |
| 21 | 88.15 | 4.25 | 7.60 | 0.494 | 0.368 |

The standard ink data set preferably comprises the data of each single ingredient ink as the standard ink data because this expands the range of an adjustable light-emitting color of the mixed ink (the data of n=1 to 3 listed in Table 1 correspond to data of the respective single ingredient inks).

The total number $n_{max}$ of the standard ink data constituting the standard ink data set is preferably as large as possible because the light-emitting color of a mixed ink can be more precisely adjusted. The standard ink data constituting the standard ink data set are preferably selected in a manner that coordinates are distributed in a larger area in the chromaticity coordinates because the mixing ratio of ingredient inks can be more reliably calculated.

The standard ink data set is preferably stored in an external storage device such as a hard disk drive connected to the controller portion 70 in a manner that the data can be read and written by the controller portion 70 and is preferably configured to be read out at the controller portion 70 (the processing portion 74) as necessary.

<Step of Receiving Request Ink Data at Controller Portion>

Next, the processing portion 74 in the controller portion 70 receives request ink data G (Gx, Gy). The request ink data G is data referred to as coordinates in the chromaticity coordinates of the light-emitting color of a mixed ink that is to be applied to the object and is to be prepared by the coating system 10.

An example of the request ink data G is listed in Table 2 and FIG. 6.

TABLE 2

| Gx | Gy |
|---|---|
| 0.300 | 0.300 |

The processing portion 74 may receive the request ink data G that is input at the input portion 72 or may receive the request ink data G that is once stored in the external storage device.

The step of determining a mixing ratio of ingredient inks will next be described with reference to FIG. 4 together with specific examples.

<Step of Receiving Standard Ink Data Set and Determining Mixing Ratio of Ingredient Inks Based on Standard Ink Data Set and Request Ink Data at Controller Portion>

Next, the processing portion 74 in the controller portion 70 receives a standard ink data set and determines a mixing ratio of a plurality of ingredient inks based on the standard ink data set and the request ink data G.

Steps comprised in the step are as follows:

1. The processing portion 74 in the controller portion 70 compares $n_{max}$ pieces (21 pieces in the example) of the standard ink data comprised in the standard ink data set with the request ink data G (S1).

2. The processing portion 74 in the controller portion 70 calculates distances between coordinates in the chromaticity coordinates of the respective standard ink data and coordinates in the chromaticity coordinates of the request ink data G to obtain distance data L (S2). The results are listed in Table 3.

TABLE 3

| | mixing ratio of the ingredient inks (weight ratio) P(m, n) | | | | | |
|---|---|---|---|---|---|---|
| | ingredient ink 1 m = 1 (% by | ingredient ink 2 m = 2 (% by | ingredient ink 3 m = 3 (% by | chromaticity C | | distance |
| n | weight) | weight) | weight) | Cx(n) | Cy(n) | L |
| 1 | 100.00 | 0.00 | 0.00 | 0.155 | 0.260 | 0.1504 |
| 2 | 0.00 | 100.00 | 0.00 | 0.306 | 0.630 | 0.3301 |

TABLE 3-continued

| | mixing ratio of the ingredient inks (weight ratio) P(m, n) | | | chromaticity C | | distance |
|---|---|---|---|---|---|---|
| n | ingredient ink 1 m = 1 (% by weight) | ingredient ink 2 m = 2 (% by weight) | ingredient ink 3 m = 3 (% by weight) | Cx(n) | Cy(n) | L |
| 3 | 0.00 | 0.00 | 100.00 | 0.668 | 0.323 | 0.3690 |
| 4 | 95.20 | 4.80 | 0.00 | 0.220 | 0.445 | 0.1658 |
| 5 | 94.40 | 0.00 | 5.60 | 0.410 | 0.296 | 0.1099 |
| 6 | 0.00 | 75.00 | 25.00 | 0.487 | 0.460 | 0.2461 |
| 7 | 98.20 | 1.80 | 0.00 | 0.185 | 0.353 | 0.1261 |
| 8 | 72.00 | 28.00 | 0.00 | 0.241 | 0.508 | 0.2161 |
| 9 | 37.00 | 63.00 | 0.00 | 0.273 | 0.567 | 0.2685 |
| 10 | 98.60 | 0.00 | 1.40 | 0.234 | 0.271 | 0.0718 |
| 11 | 96.70 | 0.00 | 3.30 | 0.324 | 0.285 | 0.0282 |
| 12 | 88.70 | 0.00 | 11.30 | 0.539 | 0.312 | 0.2395 |
| 13 | 0.00 | 92.20 | 7.80 | 0.363 | 0.566 | 0.2739 |
| 14 | 0.00 | 84.50 | 15.50 | 0.425 | 0.512 | 0.2462 |
| 15 | 0.00 | 53.70 | 46.30 | 0.578 | 0.386 | 0.2906 |
| 16 | 47.87 | 49.83 | 2.30 | 0.348 | 0.499 | 0.2048 |
| 17 | 93.19 | 5.01 | 1.80 | 0.312 | 0.425 | 0.1258 |
| 18 | 96.04 | 2.06 | 1.90 | 0.291 | 0.355 | 0.0560 |
| 19 | 65.29 | 30.31 | 4.40 | 0.413 | 0.438 | 0.1782 |
| 20 | 91.95 | 2.65 | 5.40 | 0.388 | 0.363 | 0.1079 |
| 21 | 88.15 | 4.25 | 7.60 | 0.494 | 0.368 | 0.2058 |

3. The processing portion 74 in the controller portion 70 ranks the distance data L and the corresponding standard ink data in ascending order of the distance based on the obtained distance data L where the ranking is indicated by W (S3) (n is stored in W). For example, when the data of n=11 at the first place in the ranking W is stored, W (1)=11. The results are listed in Table 4.

TABLE 4

| | mixing ratio of the ingredient inks (weight ratio) P(m, n) | | | chromaticity C | | distance | ranking |
|---|---|---|---|---|---|---|---|
| n | ingredient ink 1 m = 1 (% by weight) | ingredient ink 2 m = 2 (% by weight) | ingredient ink 3 m = 3 (% by weight) | Cx(n) | Cy(n) | L | W |
| 11 | 96.700 | 0.000 | 3.300 | 0.324 | 0.285 | 0.028 | 1 |
| 18 | 96.040 | 2.060 | 1.900 | 0.291 | 0.355 | 0.056 | 2 |
| 10 | 98.600 | 0.000 | 1.400 | 0.234 | 0.271 | 0.072 | 3 |
| 20 | 91.951 | 2.649 | 5.400 | 0.388 | 0.363 | 0.108 | 4 |
| 5 | 94.400 | 0.000 | 5.600 | 0.410 | 0.296 | 0.110 | 5 |
| 17 | 93.192 | 5.008 | 1.800 | 0.312 | 0.425 | 0.126 | 6 |
| 7 | 98.200 | 1.800 | 0.000 | 0.185 | 0.353 | 0.126 | 7 |
| 1 | 100.000 | 0.000 | 0.000 | 0.155 | 0.260 | 0.150 | 8 |
| 4 | 95.200 | 4.800 | 0.000 | 0.220 | 0.445 | 0.166 | 9 |
| 19 | 65.295 | 30.305 | 4.400 | 0.413 | 0.438 | 0.178 | 10 |
| 16 | 47.873 | 49.827 | 2.300 | 0.348 | 0.499 | 0.205 | 11 |
| 21 | 88.150 | 4.250 | 7.600 | 0.494 | 0.368 | 0.206 | 12 |
| 8 | 72.000 | 28.000 | 0.000 | 0.241 | 0.508 | 0.216 | 13 |
| 12 | 88.700 | 0.000 | 11.300 | 0.539 | 0.312 | 0.240 | 14 |
| 6 | 0.000 | 75.000 | 25.000 | 0.487 | 0.460 | 0.246 | 15 |
| 14 | 0.000 | 84.500 | 15.500 | 0.425 | 0.512 | 0.246 | 16 |
| 9 | 37.000 | 63.000 | 0.000 | 0.273 | 0.567 | 0.269 | 17 |
| 13 | 0.000 | 92.200 | 7.800 | 0.363 | 0.566 | 0.274 | 18 |
| 15 | 0.000 | 53.700 | 46.300 | 0.578 | 0.386 | 0.291 | 19 |
| 2 | 0.000 | 100.000 | 0.000 | 0.306 | 0.630 | 0.330 | 20 |
| 3 | 0.000 | 0.000 | 100.000 | 0.668 | 0.323 | 0.369 | 21 |

4. The processing portion 74 in the controller portion 70 obtains an equation of a first straight line S passing through first coordinates (Cx (W (1)), Cy (W (1))) that are the coordinates in the chromaticity coordinates of the standard ink data at the first place in the ranking W and passing through second coordinates (Cx (W (2)), Cy (W (2))) that are the coordinates of the standard ink data at the second place (S4). In the below description, coordinates (Cx (W (a)), Cy (W (a))) at an a-th place in the ranking W are called a-th coordinates. "a" is an integer of 1 or more and $n_{max}$ or less.

As illustrated in FIG. 7, the equation S obtained in the example is referred to as S: y=−2.1929x+0.9944.

5. The processing portion 74 in the controller portion 70 determines a-th coordinates (a≥3) such that the coordinates (Gx, Gy) of the request ink data G are comprised in an area surrounded by straight lines passing through the first coordinates, the second coordinates, and the a-th coordinates in the standard ink data set.

The step further comprises the following steps.

[1] The processing portion 74 selects a-th coordinates. For the first calculation, the a-th coordinates to be selected are the third coordinates that are at the highest place in the standard ink data set except the first coordinates and the second coordinates. That is, a=3. When the calculation is repeated as a result of the determination in (S8) and (S13), a is an integer more than 3.

[2] The processing portion 74 obtains an equation of a second straight line T passing through the a-th coordinates and the coordinates (Gx, Gy) of the request ink data G (S5).

As illustrated in FIG. 7, the equation T obtained in the example is referred to as T: y=0.4346x+0.1696.

[3] The processing portion 74 obtains coordinates (Kx, Ky) of the intersection point K of the first straight line S and the second straight line T (S6). As listed in Table 5, the coordinates (Kx, Ky) of the intersection point K are (0.3139, 0.3060) in the example.

[4] The processing portion 74 determines whether at least one of conditions (1) and (2) below is satisfied (S7).

(1) x-coordinate value (Cx (W (a))) of the a-th coordinates≥x-coordinate value (Gx) of the request ink data ≥x-coordinate value (Kx) of the intersection point K (2) x-coordinate value (Cx (W (a))) of the a-th coordinates≤x-coordinate value (Gx) of the request ink data ≤x-coordinate value (Kx) of the intersection point K When at least one of the conditions (1) and (2) is satisfied, the coordinates of the request ink data G are comprised in the area surrounded by the straight lines passing through the first coordinates (Cx (W (1)), Cy (W (1))), the second coordinates (Cx (W (2)), Cy (W (2))), and the a-th coordinates (Cx (W (a)), Cy (W (a))).

In the example, Cx (W (a))= 0.234≤Gx=0.300≤Kx=0.3139, which satisfies the condition. Thus, Gx is comprised in the area surrounded by the straight lines passing through the first coordinates, the second coordinates, and the a-th coordinates.

[5] As illustrated in FIG. 8, when at least one of the conditions (1) and (2) is satisfied (Yes at S8), the processing portion 74 obtains a first distance value Q1 from the first coordinates to the coordinates of the intersection point K and a second distance value Q2 from the second coordinates to the coordinates of the intersection point K (S9). As listed in Table 5, Q1 is 0.0234, and Q2 is 0.0542 in the example.

The a-th coordinates are determined through the steps.

6. As illustrated in FIG. 8, the processing portion 74 in the controller portion 70 determines a mixing ratio of the ingredient inks (the ingredient ink 1, the ingredient ink 2, and the ingredient ink 3) at the intersection point K based on the first distance value Q1 and the second distance value Q2 (S10).

In the step, the mixing ratio of the ingredient ink 1, the ingredient ink 2, and the ingredient ink 3 is determined in accordance with the below formula by collinear approximation of the first straight line S and the second straight line T.

The mixing ratio (Pk (m)) of ingredient inks at the intersection point K is represented by the below formula.

$$Pk(m)=P(m, W(1))+(P(m, W(2))-P(m, W(1)))\times Q1/(Q1+Q2) \quad \text{Formula}$$

As listed in Table 5 below, as for the mixing ratio Pk of the ingredient inks at the intersection point K in the example, the mixing ratio Pk (1) of the ingredient ink 1 is 96.50 (% by weight), the mixing ratio Pk (2) of the ingredient ink 2 at the intersection point K is 0.62 (% by weight), and the mixing ratio Pk (3) of the ingredient ink 3 at the intersection point K is 2.88 (% by weight).

7. As illustrated in FIG. 8, the processing portion 74 in the controller portion 70 obtains a third distance value R1 from the a-th coordinates to the coordinates (Gx, Gy) of the request ink data G and a fourth distance value R2 from the coordinates (Gx, Gy) of the request ink data G to the coordinates of the intersection point K (S11). As listed in Table 5 below, R1 is 0.0718, and R2 is 0.0151 in the example.

8. The processing portion 74 determines the mixing ratio of the ingredient inks (the ingredient ink 1, the ingredient ink 2, and the ingredient ink 3) corresponding to the request ink data G based on the third distance value R1 and the fourth distance value R2 (S12).

The mixing ratio Pg (m) of the ingredient inks at the coordinates (Gx, Gy) of the request ink data G can be determined in accordance with the below formula by collinear approximation of the first straight line S and the second straight line T.

$$Pg(m)=P(m, W(a))+(Pk(m)-P(m, W(a)))\times R1/(R1+R2) \quad \text{Formula}$$

In the example, as listed in Table 5 below, as for the mixing ratio Pg of the ingredient inks at the coordinates (Gx, Gy) of the request ink data G, the mixing ratio Pg (1) of the ingredient ink 1 is 96.87 (% by weight), the mixing ratio Pg (2) of the ingredient ink 2 at the coordinates (Gx, Gy) of the request ink data G is 0.51 (% by weight), and the mixing ratio Pg (3) of the ingredient ink 3 at the coordinates (Gx, Gy) of the request ink data G is 2.62 (% by weight).

9. When neither the condition (1) nor (2) is satisfied (No at S8), the processing portion 74 determines whether a is smaller than $n_{max}$, that is, whether all the chromaticity data of the standard ink data is compared (S13).

10. When a is smaller than $n_{max}$ (Yes at S13), a is taken as a+1 (a+1 is substituted for a).

Next, the step returns to S5, and the processing portion 74 repeats S6 to S8, S13, and S14 until at least one of the conditions (1) and (2) is satisfied (until Yes at S8).

11. When a is equal to $n_{max}$ (No at S13), the present standard ink data set comprises no such standard ink data that the coordinates (Gx, Gy) of the request ink data G are comprised in the area surrounded by the straight lines passing through the first coordinates, the second coordinates, and the a-th coordinates. Thus, the processing portion 74 selects another standard ink data set to which, for example, α (α is an integer of 1 or more) pieces of standard ink data are added and recompares the standard ink data with the request ink data G (S15).

Next, the step returns to S2 and repeats S2 and the following steps.

Through the above steps, the processing portion 74 determines the mixing ratio of the ingredient inks (the ingredient ink 1, the ingredient ink 2, and the ingredient ink 3) corresponding to the request ink data G.

The steps that determine the mixing ratio of three ingredient inks are described above. The present invention is not limited to the example but can be applied to an embodiment using four or more ingredient inks. For example, when four ingredient inks are used, four pieces of standard ink data are selected and are compared with the request ink data. The following steps are carried out in the same manner as in the case using three ingredient inks, and consequently the mixing ratio of four ingredient inks corresponding to the request ink data can be determined.

The step of preparing a mixed ink by the coating system 10 based on the determined mixing ratio of the ingredient inks will next be described with reference to from FIG. 1 to FIG. 3-2, as necessary.

<Step of Determining Amounts of Ingredient Inks Supplied to Stirring Tank Based on Determined Mixing Ratio at Controller Portion>

The processing portion 74 in the controller portion 70 determines the respective required amounts of a plurality (three types in the example) of ingredient inks (the ingre-

TABLE 5

| | mixing ratio of the ingredient inks (weight ratio) P(m, n) | | | | | | | | |
|---|---|---|---|---|---|---|---|---|---|
| | ingredient ink 1 m = 1 (% by | ingredient ink 2 m = 2 (% by | ingredient ink 3 m = 3 (% by | chromaticity C | | | | distance | distance |
| n | weight) | weight) | weight) | Cx(n) | Cy(n) | L | ranking W | distance Q | R |
| 11 | 96.70 | 0.00 | 3.30 | 0.324 | 0.285 | 0.0282 | 1 | 0.0234 (Q1) | |
| 18 | 96.04 | 2.06 | 1.90 | 0.291 | 0.355 | 0.0560 | 2 | 0.0542 (Q2) | |
| 10 | 98.60 | 0.00 | 1.40 | 0.234 | 0.271 | 0.0718 | 3 | | 0.0718 (R1) |
| K | | | | 0.314 | 0.306 | 0.0151 | | | 0.0151 (R2) |
| Pk | Pk (1) = 96.50 | Pk (2) = 0.62 | Pk (3) = 2.88 | | | | | | |
| Pk | Pg (1) = 96.87 | Pg (2) = 0.51 | Pg (3) = 2.62 | | | | | | | dient ink 1, the ingredient ink 2, and the ingredient ink 3), that is, the amounts of the ingredient inks to be supplied to the stirring tank 50, based on the determined mixing ratio and the required amount of the mixed ink.

<Step of Receiving Flow Measurement Data Measured at Flow Measurement Portion and Input from Flow Measurement Portion into Input Portion, at Controller Portion>

The ingredient ink supply portion 20 (the first ingredient ink tank 22*a*, the second ingredient ink tank 22*b*, and the third ingredient ink tank 22*c*) starts to deliver the ingredient inks (the ingredient ink 1, the ingredient ink 2, and the ingredient ink 3), and the flow measurement portion 32 (the first sensor 32*a*, the second sensor 32*b*, and the third sensor 32*c*) in the supply regulator portion 30 starts to measure the flow rates of the delivered ingredient inks.

The flow measurement portion 32 (the first sensor 32*a*, the second sensor 32*b*, and the third sensor 32*c*) sends the respective data of the measured flow rates (flow measurement data) of the ingredient inks to the controller portion 70 through the electric telecommunication line 80.

The input portion 72 of the controller portion 70 allows the processing portion 74 to receive the flow measurement data input through the electric telecommunication line 80.

<Step of Determining Operation of Supply Regulator Portion for Supplying Respective Ingredient Inks in Determined Amounts and Outputting Setup Signal for Performing Operation from Output Portion, at Controller Portion>

The processing portion 74 in the controller portion 70 having received the flow measurement data determines operation of the regulator portion 34 (the first regulator valve 34*a*, the second regulator valve 34*b*, and the third regulator valve 34*c*). An embodiment of the operation comprises operation of changing the degree of opening of the regulator valve as the regulator portion 34 based on the flow measurement data.

The processing portion 74 generates a setup signal for performing the operation at the regulator portion 34 and outputs the setup signal to the regulator portion 34 through the electric telecommunication line 80.

<Step of Supplying Respective Ingredient Inks in Determined Amounts into Stirring Tank Based on Input Setup Signal at Supply Regulator Portion>

The supply regulator portion 30 appropriately regulates the respective degrees of opening of the regulator portion 34 of, for example, the first regulator valve 34*a*, the second regulator valve 34*b*, and the third regulator valve 34*c* based on the input setup signal to regulate the respective amounts of the ingredient inks (the ingredient ink 1, the ingredient ink 2, and the ingredient ink 3) and supplies the respective ingredient inks in the determined amounts into the stirring tank 50.

When the front valve 35, the diaphragm metering pump 36, and the rear valve 37 are used as the supply regulator portion 30 as described with reference to FIG. 3-1, the operation is as follows:

1. The processing portion 74 in the controller portion 70 outputs a setup signal through the electric telecommunication line 80. In response to the setup signal input, the rear valve 37 in the supply regulator portion 30 is closed, and the front valve 35 is opened. This operation supplies the ingredient ink to the diaphragm metering pump 36.

2. The processing portion 74 in the controller portion 70 outputs a setup signal through the electric telecommunication line 80. In response to the setup signal input, the ingredient ink is supplied into and stored in the cylinder of the diaphragm metering pump 36 in the supply regulator portion 30. The amount of the ingredient ink stored in the cylinder is regulated by a moving amount of the diaphragm. The amount of the ingredient ink is the amount determined in the step described above.

3. The processing portion 74 in the controller portion 70 outputs a setup signal through the electric telecommunication line 80. In response to the setup signal input, the front valve 35 in the supply regulator portion 30 is closed, and the rear valve 37 is opened. The controller portion 70 (processing portion 74) outputs a setup signal through the electric telecommunication line 80. In response to the setup signal, the diaphragm of the diaphragm metering pump 36 is operated to push the ingredient ink in the cylinder out, and only the determined and required amount of the ingredient ink is supplied to the stirring tank 50.

<Step of Mixing Supplied Ingredient Inks with Ink Stirring Mechanism Provided in Stirring Tank to Prepare Mixed Ink for Coating>

In the stirring tank 50 having received the required amounts of the ingredient inks (the ingredient ink 1, the ingredient ink 2, and the ingredient ink 3), the supplied ingredient inks are stirred with the ink stirring mechanism 52 provided in the stirring tank 50 to obtain a homogeneously prepared mixed ink.

<Step of Applying Mixed Ink onto the Object>

The mixed ink stored in the stirring tank 50 is supplied to various systems of the coating devices 100 previously described. The mixed ink is transported using the ink transport portion 120 to the ink discharge portion 130. The mixed ink discharged from the ink discharge portion 130 is applied onto the object such as a substrate on which electrodes are formed, for example.

As described above, the coating system and the method for manufacturing a light-emitting device of the present invention allow on-demand preparation and coating of respective mixed inks corresponding to a plurality of light-emitting colors that are different with each other for individual substrates, for example. The system and the method eliminate the necessity of complicated steps such as preparation of each ink corresponding to a light-emitting color in advance and replacement of tanks storing respective inks at an appropriate timing. Thus, a plurality of mixed inks can be applied and plural types of light-emitting devices having a plurality of light-emitting colors can be continuously manufactured. As described above, various light-emitting devices each comprising a light-emitting layer having a different light-emitting color with each other can be speedily manufactured through a simple step.

<Step of Operation of Washing Portion>

The operation of a washing portion 60 (washing step) will next be described.

First, the ingredient inks and the mixed ink stored in the stirring tank 50 are completely discharged using the ink transport portion 120 in the coating device 100, for example, through a discharge pipe and a discharge liquid tank connected to the discharge pipe (not illustrated), and through the ink discharge portion 130.

Next, the inert gas supply portion 62 is operated to supply a washing solution to the stirring tank 50. The ink stirring mechanism 52 is then operated, for example, to stir the washing solution and the inside of the stirring tank 50 is washed.

Next, the washing solution (discharge liquid) in the stirring tank 50 is discharged from the coating system 10 using the ink transport portion 120 through the discharge pipe, the discharge liquid tank, and the ink discharge portion 130.

Configuration examples applicable to the light-emitting device of the present invention, structures of each layer, and methods of forming the layer will now be described.

The light-emitting device of the present invention mainly comprises an anode, a cathode, and a light-emitting layer interposed between the pair of electrodes.

Examples of the layer provided between the cathode and the light-emitting layer may include an electron injection layer, an electron transport layer, and a hole block layer. When both of the electron injection layer and the electron transport layer are provided between the cathode and the light-emitting layer, a layer in contact with the cathode is referred to as the electron injection layer, and the layer excluding the electron injection layer is referred to as the electron transport layer.

The electron injection layer has a function of improving electron injection efficiency from the cathode. The electron transport layer has a function of improving electron injection from the cathode, the electron injection layer, or the electron transport layer closer to the cathode.

The hole block layer is a layer having a function of blocking the transport of holes. When the electron injection layer and/or the electron transport layer has a function of blocking the transport of holes, the layer may also serve as the hole block layer.

The function of the hole block layer of blocking the transport of holes can be confirmed by manufacturing a light-emitting device in which only hole current flows and observing an effect of blocking holes through the reduction in the current value, for example.

Examples of the layer provided between the anode and the light-emitting layer may include a hole injection layer, a hole transport layer, and an electron block layer. When both of the hole injection layer and the hole transport layer are provided between the anode and the light-emitting layer, a layer in contact with the anode is referred to as the hole injection layer, and the layer excluding the hole injection layer is referred to as the hole transport layer.

The hole injection layer has a function of improving hole injection efficiency from the anode. The hole transport layer has a function of improving hole injection from the anode, the hole injection layer, or the hole transport layer closer to the anode.

The electron block layer has a function of blocking the transport of electrons. When the hole injection layer and/or the hole transport layer has a function of blocking the transport of electrons, the layer may also serve as the electron block layer.

The function of the electron block layer of blocking the transport of electrons can be confirmed by manufacturing a light-emitting device in which only electron current flows and observing an effect of blocking electrons through the reduction in the measured current value, for example.

Layer structures applicable to the light-emitting device may be as follows:
a) Anode/Light-emitting layer/Cathode
b) Anode/Hole injection layer/Light-emitting layer/Cathode
c) Anode/Hole injection layer/Light-emitting layer/Electron injection layer/Cathode
d) Anode/Hole injection layer/Light-emitting layer/Electron transport layer/Electron injection layer/Cathode
e) Anode/Hole injection layer/Hole transport layer/Light-emitting layer/Cathode
f) Anode/Hole injection layer/Hole transport layer/Light-emitting layer/Electron injection layer/Cathode
g) Anode/Hole injection layer/Hole transport layer/Light-emitting layer/Electron transport layer/Electron injection layer/Cathode
h) Anode/Light-emitting layer/Electron injection layer/Cathode
i) Anode/Light-emitting layer/Electron transport layer/Electron injection layer/Cathode where a symbol "/" indicates that the layers on either side of the symbol "/" are adjacently stacked. The same shall apply hereinafter.

The light-emitting device of the present invention may comprise a single light-emitting layer or comprise two or more light-emitting layers. The structure of the light-emitting device having two light-emitting layers may be a layer structure of j) below where a stacked body interposed between the anode and the cathode in any one of the layer structures of a) to i) above is indicated by a "structural unit A". The layer structures of the two (structural units A) may be the same or different from each other.
j) Anode/(Structural unit A)/Charge generation layer/(Structural unit A)/Cathode The charge generation layer is a layer generating holes and electrons when an electric field is applied to the layer. Examples of the charge generation layer may include thin films made of vanadium oxide, indium tin oxide (ITO), molybdenum oxide, and the like.

The structure of the light-emitting device having three or more light-emitting layers may be a layer structure of k) below where "(Structural unit A)/Charge generation layer" is indicated by a "structural unit B".
k) Anode/(Structural unit B)x/(Structural unit A)/Cathode In this structure, a symbol "x" is an integer of two or more, and "(Structural unit B)x" is a stacked body that is formed by stacking the structural unit B x times. The layer structures of the plurality of (structural units B) may be the same or different from each other.

Without any charge generation layer interposed, a plurality of light-emitting layers may be directly stacked to constitute a light-emitting device.

The light-emitting device having the above structure is generally provided on a substrate. The order or the number of the layers to be formed and the thickness of each layer can be appropriately designed in consideration of light-emitting efficiency and life.

The light-emitting device is generally provided on a substrate while the anode is disposed on the substrate. The light-emitting device may also be provided on a substrate while the cathode is disposed on the substrate. For example, to produce each of the light-emitting devices having the structures a) to k) on a substrate, the respective layers are successively stacked on the substrate from the anode layer (from the left layer in each structure of a to k) when the anode is disposed on the substrate, or the respective layers are successively stacked on the substrate from the cathode layer (from the right layer in each structure of a to k) when the cathode is disposed on the substrate. The light-emitting device may be a bottom emission type, which emits light from the substrate side, or may be a top emission type, which emits light from the opposite side to the substrate.

The material and the formation method of each layer constituting the light-emitting device will next be described in further detail.

<Substrate>

A substrate that is not chemically degraded in a step of manufacturing the light-emitting device is preferably used, and examples of the substrate may include glass substrates, plastic substrates, polymer film substrates, silicon plate substrates, and stacked substrates of them. On the substrate, a driving circuit for driving the light-emitting device may be formed in advance.

<Anode>

For a light-emitting device having a structure of emitting light from the light-emitting layer through the anode, an electrode having optical transparency is used as the anode. The electrode having optical transparency can be thin films of metal oxides, metal sulfides, metals, and other materials having high electric conductivity, and thin films having high optical transparency are preferably used. For example, thin films made of indium oxide, zinc oxide, tin oxide, ITO, indium zinc oxide (IZO), gold, platinum, silver, copper, and the like are used. Among them, thin films made of ITO, IZO, and tin oxide are preferably used. Examples of the method of forming the anode may include a vacuum evaporation method, a sputtering method, an ion plating method, and a plating method. The anode may be a transparent conductive film of an organic substance such as polyaniline or derivatives thereof and polythiophene or derivatives thereof.

The anode may be made of a material reflecting light, and the material is preferably metals, metal oxides, and metal sulfides having a work function of 3.0 eV or more.

The thickness of the anode can be appropriately designed in consideration of optical transparency, electric conductivity, and other characteristics. The anode has a thickness of, for example, 10 nm to 10 µm, preferably 20 nm to 1 µm, and more preferably 50 nm to 500 nm.

<Hole Injection Layer>

Examples of the hole injection material constituting the hole injection layer may include oxides such as vanadium oxide, molybdenum oxide, ruthenium oxide, and aluminum oxide, phenylamine compounds, starburst amine compounds, phthalocyanine compounds, amorphous carbon, polyaniline, and polythiophene derivatives.

Examples of the method of forming the hole injection layer may include film formation from an ink containing the hole injection material. The hole injection layer can be formed by the coating method previously described or other certain, known methods.

The optimum thickness of the hole injection layer varies with a material used and is appropriately designed in consideration of intended characteristics and easiness of film formation. The hole injection layer has a thickness of, for example, 1 nm to 1 µm, preferably 2 nm to 500 nm, and more preferably 5 nm to 200 nm.

<Hole Transport Layer>

The hole transport layer comprised in the light-emitting device of the present invention contains hole transport materials. The hole transport material may be any organic compounds having a hole transport function. Specific examples of the organic compound having a hole transport function may include polyvinylcarbazole or derivatives thereof, polysilane or derivatives thereof, polysiloxane derivatives having an aromatic amine residue on a side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, polyarylamine or derivatives thereof, poly(p-phenylene vinylene) or derivatives thereof, polyfluorene derivatives, macromolecular compounds having an aromatic amine residue, and poly(2,5-thienylene vinylene) or derivatives thereof.

The organic compound having a hole transport function is preferably macromolecular compounds, for example, polymers. This is because if the organic compound is a macromolecular compound, the film formability is improved and light-emitting characteristics are homogeneous. For example, the organic compound has a polystyrene-equivalent number average molecular weight of 10,000 or more, preferably $3.0 \times 10^4$ to $5.0 \times 10^5$, and more preferably $6.0 \times 10^4$ to $1.2 \times 10^5$. The organic compound is a polymer having a polystyrene-equivalent weight average molecular weight of $1.0 \times 10^4$ or more, preferably $5.0 \times 10^4$ to $1.0 \times 10^6$, and more preferably $1.0 \times 10^5$ to $6.0 \times 10^5$.

Specific examples of the hole transport material may include compounds described in JP S63-70257 A, JP S63-175860 A, JP H2-135359 A, JP H2-135361 A, JP H2-209988 A, JP H3-37992 A, and JP H3-152184 A.

Among them, the organic compound having a hole transport function is preferably macromolecular hole transport materials such as polyvinylcarbazole or derivatives thereof, polysilane or derivatives thereof, polysiloxane derivatives having an aromatic amine residue on a side chain or the main chain, polyaniline or derivatives thereof, polythiophene or derivatives thereof, polyfluorene derivatives, macromolecular compounds having an aromatic amine residue, poly(p-phenylene vinylene) or derivatives thereof, and poly(2,5-thienylene vinylene) or derivatives thereof, and more preferably polyvinylcarbazole or derivatives thereof, polysilane or derivatives thereof, polysiloxane derivatives having an aromatic amine residue on a side chain or the main chain, polyfluorene derivatives, and macromolecular compounds having an aromatic amine residue. When the organic compound having a hole transport function has a low molecular weight, the compound is preferably dispersed in a macromolecular binder.

The polyvinylcarbazole or derivatives thereof can be obtained by cationic polymerization or radical polymerization of vinyl monomers, for example.

Examples of the polysilane or derivatives thereof may include compounds described in Chem. Rev., vol. 89, p. 1359 (1989) and the specification of British Patent No. 2,300,196. The compounds can be synthesized by the method described in the documents. The synthetic method is specifically, preferably a Kipping method.

In polysiloxane or derivatives thereof, the siloxane skeleton hardly has hole transport characteristics, and thus a compound having a structure of a low molecular hole transport material on a side chain or the main chain is preferably used. Specifically examples may include a compound having an aromatic amine residue with hole transport characteristics on a side chain or the main chain.

In the present specification, "macromolecular (compound)" means a polymer having a molecular weight distribution and a polystyrene-equivalent number average molecular weight of $1 \times 10^3$ to $1 \times 10^8$. A "low molecular (compound)" means a compound having no molecular weight distribution and a molecular weight of $1 \times 10^4$ or less.

The organic compound having a hole transport function is preferably a polymer having a fluorenediyl group of following Formula (1). This is because such a polymer improves the hole injection efficiency to increase the current density on driving when the polymer is brought into contact with an organic compound having a condensation ring or a plurality of aromatic rings to form the hole transport layer in an organic light-emitting device.

[Chemical Formula 1]

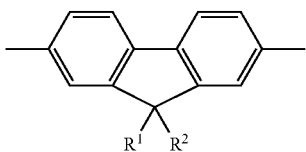

(1)

In Formula (1), $R^1$ and $R^2$ may be the same or different from each other and are independently a hydrogen atom, an alkyl group, an alkoxy group, an aryl group, or a monovalent heterocyclic group. Examples of the alkyl group may include $C_{1-10}$ alkyl groups. Examples of the alkoxy group may include $C_{1-10}$ alkoxy groups. Examples of the aryl group may include a phenyl group and a naphthyl group and the like. Examples of the monovalent heterocyclic group may include a pyridyl group and the like. The aryl group and the monovalent heterocyclic group may have a substituent. Examples of the substituent may include $C_{1-10}$ alkyl groups and $C_{1-10}$ alkoxy groups because such a substituent can improve the solubility of a polymer. The substituent that the aryl group and the monovalent heterocyclic group may have may have a cross-linking group.

Examples of the cross-linking group may include a vinyl group, an ethynyl group, a butenyl group, groups having an acrylic structure, groups having an acrylate structure, groups having an acrylamide structure, groups having a methacryl structure, groups having a methacrylate structure, groups having a methacrylamide structure, groups having a vinyl ether structure, a vinyl amino group, groups having a silanol structure, and groups having a small ring (such as cyclopropane, cyclobutane, epoxy, oxetane, diketene, and episulfide and the like).

Specific examples of the preferred fluorenediyl group are shown below.

[Chemical Formula 2]

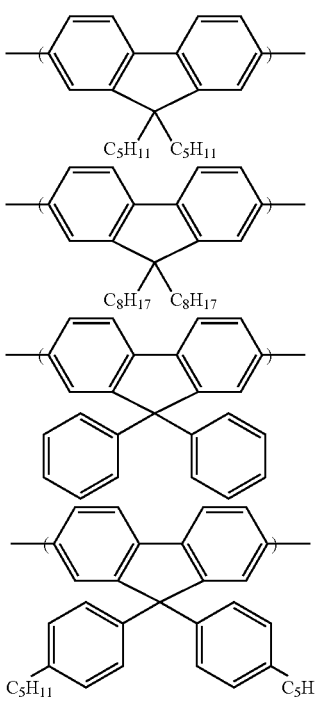

-continued

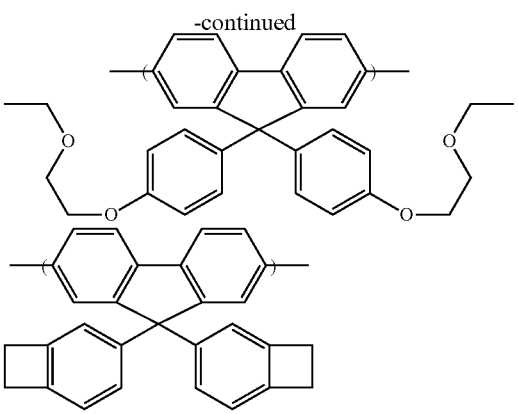

Specifically preferred organic compounds having hole transport characteristics are polymers containing the fluorenediyl group and the structure of an aromatic tertiary amine compound as constitutional unit, such as polyarylamine polymers.

The constitutional unit containing the structure of an aromatic tertiary amine compound may be constitutional unit represented by following Formula (2).

[Chemical Formula 3]

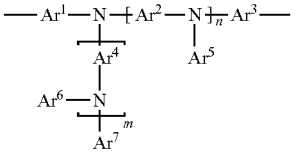

(2)

In Formula (2), $Ar^1$, $Ar^2$, $Ar^3$, and $Ar^4$ are each independently an arylene group or a divalent heterocyclic group. $Ar^5$, $Ar^6$, and $Ar^7$ are each independently an aryl group or a monovalent heterocyclic group. $Ar^6$ and $Ar^7$ may form a ring together with the nitrogen atom to which $Ar^6$ and $Ar^7$ are bonded, in place of the above group. m and n are each independently 0 or 1.

Examples of the arylene group may include a phenylene group and the like, and examples of the divalent heterocyclic group may include a pyridinediyl group and the like. These groups may have a substituent.

Examples of the aryl group may include a phenyl group and a naphthyl group and the like, and examples of the monovalent heterocyclic group may include a pyridyl group and the like. These groups may have a substituent.

Examples of the monovalent heterocyclic group may include a thienyl group, a furyl group, and a pyridyl group and the like.

The substituent that the arylene group, the aryl group, the divalent heterocyclic group, and the monovalent heterocyclic group may have is preferably an alkyl group, an alkoxy group, and an aryl group and more preferably an alkyl group because such a substituent can improve the solubility of the macromolecular compound. Examples of the alkyl group may include $C_{1-10}$ alkyl groups. Examples of the alkoxy group may include $C_{1-10}$ alkoxy groups. Examples of the aryl group may include a phenyl group and a naphthyl group and the like.

These substituents may have a cross-linking group. Examples of the cross-linking group may include a vinyl group, an ethynyl group, a butenyl group, groups having an acrylic structure, groups having an acrylate structure, groups having an acrylamide structure, groups having a methacryl structure, groups having a methacrylate structure, groups having a methacrylamide structure, groups having a vinyl ether structure, a vinyl amino group, groups having a silanol structure, and groups having a small ring (such as cyclopropane, cyclobutane, epoxy, oxetane, diketene, and episulfide and the like).

$Ar^1$, $Ar^2$, $Ar^3$, and $Ar^4$ are preferably an arylene group and more preferably a phenylene group. $Ar^5$, $Ar^6$, and $Ar^7$ are preferably an aryl group and more preferably a phenyl group.

A carbon atom in $Ar^2$ and a carbon atom in $Ar^3$ may be directly bonded, or a carbon atom in $Ar^2$ and a carbon atom in $Ar^3$ may be bonded through a divalent group such as —O— and —S—.

m and n are preferably 0 because a monomer is easily synthesized.

Specific examples of the constitutional unit of Formula (2) may include the following constitutional units.

[Chemical Formula 4]

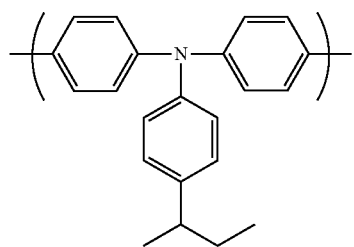

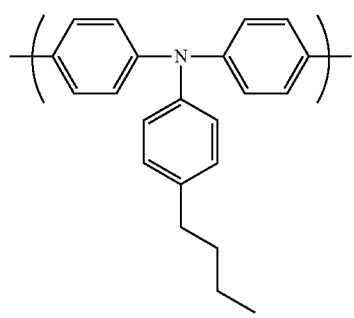

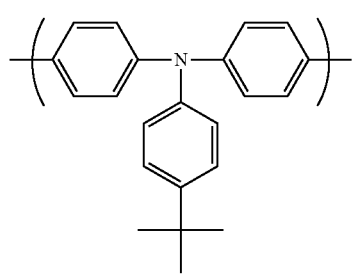

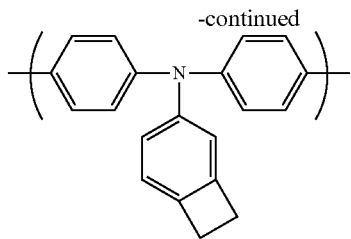

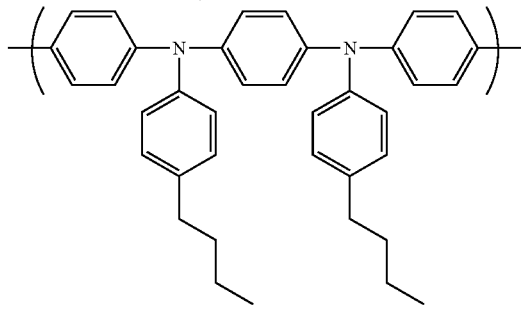

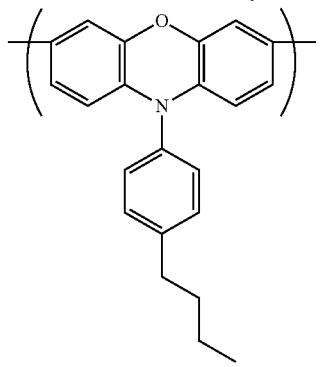

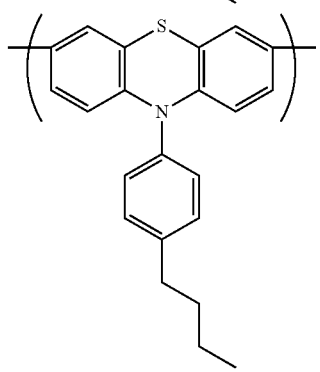

The method of forming the hole transport layer is not limited and may be a film formation method using a mixed solution with a macromolecular binder when the organic compound having a hole transport function is a low molecular compound. When the organic compound having a hole transport function is a macromolecular compound, the method of forming the hole transport layer is the method using a solution.

The film formation method using a solution may use any solvents capable of dissolving the hole transport material. Examples of the solvent may include chloride solvents such as chloroform, methylene chloride, and dichloroethane and the like; ether solvents such as tetrahydrofuran and the like; aromatic hydrocarbon solvents such as toluene and xylene and the like; ketone solvents such as acetone and methyl ethyl ketone and the like; and ester solvents such as ethyl acetate, butyl acetate, and ethyl cellosolve acetate and the like.

Examples of the film formation method using a solution may include coating methods such as a spin coating method, a casting method, a micro-gravure coating method, a gravure coating method, a bar coating method, a roll coating method, a wire bar coating method, a dip coating method, a spray coating method, a screen printing method, a flexographic printing method, an offset printing method, and an ink-jet printing method and the like.

Examples of the macromolecular binder miscible with the solution preferably may include binders that do not excessively block charge transport, and a binder having a small absorption with respect to visible light is preferably used. Examples of the macromolecular binder may include polycarbonate, polyacrylate, polymethyl acrylate, polymethyl methacrylate, polystyrene, polyvinyl chloride, and polysiloxane and the like.

The optimum thickness of the hole transport layer varies with a material used and can be designed so as to achieve an appropriate drive voltage and light-emitting efficiency. The thickness at least generating no pinhole is required, and an excessively large thickness may increase the drive voltage of a device. The hole transport layer has a thickness of, for example, 1 nm to 1 µm, preferably 2 nm to 500 nm, and more preferably 5 nm to 200 nm.

<Light-Emitting Layer>

The light-emitting layer generally, mainly contains an organic substance that emits fluorescence and/or phosphorescence, or the organic substance and a dopant that assists the organic substance. The dopant is added in order to improve the light-emitting efficiency or to change the emission wavelength, for example. The organic substance is preferably a macromolecular compound in terms of the solubility. The light-emitting layer preferably contains a macromolecular compound having a polystyrene-equivalent number average molecular weight of $10^3$ to $10^8$. Examples of the light-emitting material constituting the light-emitting layer may include the following dye materials, metal complex materials, macromolecular materials, and dopant materials.

(Dye Material)

Examples of the dye material may include cyclopendamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives and the like.

(Metal Complex Material)

Examples of the metal complex material may be metal complexes having as a central metal, a rare-earth metal such as Tb, Eu, and Dy, Al, Zn, Be, Pt, Ir, or the like and having as a ligand, oxadiazole, thiadiazole, phenylpyridine, phenylbenzimidazole, quinoline, or the like. Examples of the metal complex may include metal complexes emitting light from the triplet excited state, such as iridium complexes and platinum complexes, aluminum quinolinol complexes, benzoquinolinol beryllium complexes, benzoxazolyl zinc complexes, benzothiazole zinc complexes, azomethyl zinc complexes, porphyrin zinc complexes, and phenanthroline europium complexes.

(Macromolecular Material)

Examples of the macromolecular material may include polyparaphenylene vinylene derivatives, polythiophene derivatives, polyparaphenylene derivatives, polysilane derivatives, polyacetylene derivatives, polyfluorene derivatives, polyvinylcarbazole derivatives, and materials obtained by polymerizing the dye materials or the metal complex materials described above.

(Dopant Material)

Examples of the dopant material may include perylene derivatives, coumarin derivatives, rubrene derivatives, quinacridone derivatives, squarylium derivatives, porphyrin derivatives, styryl dyes, tetracene derivatives, pyrazolone derivatives, decacyclene, and phenoxazon.

The light-emitting layer generally has a thickness of about 2 nm to 200 nm.

To form the light-emitting layer, the method of using the coating system 10 of the present invention to apply an ink (mixed ink) containing a light-emitting material onto the object is employed as described above. To form two or more light-emitting layers, the previously described step is performed twice or more using the coating system 10.

<Electron Transport Layer>

As the electron transport material constituting the electron transport layer, known materials may be used. Examples of the electron transport material constituting the electron transport layer may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, 8-hydroxyquinoline or metal complexes of derivatives of 8-hydroxyquinoline, polyquinoline or derivatives thereof, polyquinoxaline or derivatives thereof, and polyfluorene or derivatives thereof.

Among them, the electron transport material is preferably oxadiazole derivatives, benzoquinone or derivatives thereof, anthraquinone or derivatives thereof, 8-hydroxyquinoline or metal complexes of derivatives of 8-hydroxyquinoline, polyquinoline or derivatives thereof, polyquinoxaline or derivatives thereof, and polyfluorene or derivatives thereof and more preferably 2-(4-biphenylyl)-5-(4-tert-butylphenyl)-1,3,4-oxadiazole, benzoquinone, anthraquinone, tris(8-quinolinol)aluminum, and polyquinoline.

The method of forming the electron transport layer is not particularly limited. Examples of the method for forming the electron transport layer using a low molecular electron transport material may include a vacuum evaporation method from powder and film formation from a solution or a molten state. Examples of the method for forming the electron transport layer using a macromolecular electron transport material may include film formation from a solution or a molten state. For the film formation from a solution or a molten state, a macromolecular binder may be used in combination. The electron transport layer can be formed by a certain known method.

The optimum thickness of the electron transport layer varies with a material used and is appropriately designed in consideration of intended characteristics and easiness of film formation. The electron transport layer has a thickness of, for example, 1 nm to 1 µm, preferably 2 nm to 500 nm, and more preferably 5 nm to 200 nm.

<Electron Injection Layer>

As the materials constituting the electron injection layer, optimal materials are appropriately selected depending on the type of the light-emitting layer. Examples of the material constituting the electron injection layer may include alkali metals, alkaline earth metals, alloys containing one or more of alkali metals and alkaline earth metals, oxides, halides, and carbonates of alkali metals or alkaline earth metals, and mixtures of these substances. Examples of the alkali metals and the oxides, halides, and carbonates of alkali metals may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metals, the oxides, halides, and carbonates of alkaline earth metals may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be a stacked body prepared by stacking two or more layers, and examples may include LiF/Ca. The electron injection layer can be formed by a prescribed known method such as an evaporation method, a sputtering method, and a printing method. The electron injection layer preferably has a thickness of about 1 nm to 1 μm.

<Cathode>

The cathode is preferably made of a material that has a small work function, facilitates electron injection into the light-emitting layer, and has high electric conductivity. For the light-emitting device emitting light from the anode side, the light emitted from the light-emitting layer is preferably reflected from the cathode to the anode in order to improve the light-emitting efficiency, and thus the cathode is preferably made of a material having high reflectance of visible light. Usable examples of the material of the cathode may include alkali metals, alkaline earth metals, transition-metals, and the group 13 metals in the periodic table. Examples of the material of the cathode may include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more of the metals; alloys of one or more of the metals with one or more of gold, silver, platinum, copper, manganese, titanium, cobalt, nickel, tungsten, and tin; and graphite or graphite intercalation compounds. Examples of the alloy may include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys and the like. The cathode may be transparent conductive electrodes made of conductive metal oxides, conductive organic substances, or the like. Specific examples of the conductive metal oxide may include indium oxide, zinc oxide, tin oxide, ITO, and IZO. Examples of the conductive organic substance may include polyaniline or derivatives thereof and polythiophene or derivatives thereof. The cathode may be a stacked body formed by stacking two or more layers. The electron injection layer may be used as the cathode.

The thickness of the cathode is appropriately designed in consideration of electric conductivity and durability. The cathode has a thickness of, for example, 10 nm to 10 μm, preferably 20 nm to 1 μm, and more preferably 50 nm to 500 nm. Examples of the method of forming the cathode may include a vacuum evaporation method, a sputtering method, and a lamination method by which a metal thin film is thermocompression bonded.

The light-emitting device described above is preferably used for curved and planar lighting apparatuses, for example, planar light sources used as the light source of scanners and display devices.

Examples of the display device equipped with the light-emitting device may include segment displays and dot-matrix displays. The dot-matrix displays comprise active matrix displays and passive matrix displays, for example.

The light-emitting device is used as a light-emitting element constituting each pixel in the active matrix displays and the passive matrix displays. The light-emitting device is used as a light-emitting device or a backlight constituting each segment in the segment displays and is used as a backlight in liquid crystal display devices.

EXAMPLES

Examples will next be described in order to explain the present invention in detail. However, the present invention is not limited to the examples.

<Preparation Example of Ingredient Ink>

Preparation examples of the ingredient inks 1 to 3 described above will be described. The alkyl group in Chemical Structural Formulae described in Preparation Examples 1 to 3 is generally a linear alkyl group.

The number average molecular weights and the weight average molecular weights were determined by size exclusion chromatography (SEC) as a polystyrene-equivalent number average molecular weight and a polystyrene-equivalent weight average molecular weight. SEC using organic solvents as the mobile phase is called gel permeation chromatography (GPC). The analysis conditions for the GPC are described below.

A measurement sample was dissolved in tetrahydrofuran at a concentration of about 0.05% by weight, and 10 μL of the solution was injected into GPC (manufactured by Shimadzu Corporation, trade name: LC-10 Avp). The mobile phase for the GPC was tetrahydrofuran at a flow rate of 2.0 mL/min. The column used was PLgel MIXED-B (manufactured by Polymer Laboratories Ltd.). The detector used was a UV-VIS detector (manufactured by Shimadzu Corporation, trade name: SPD-10Avp).

The measurement of emission spectra was carried out as follows: a solution of a macromolecular material in xylene was used; the solution was applied onto a quartz substrate by a spin coating method under appropriate conditions such as the concentration of the solution and the rotation speed so as to obtain a thin film having a thickness of about 60 nm; and the thin film was subjected to the measurement. The measurement equipment used for the emission spectra was a fluorescence spectrophotometer (manufactured by JASCO Corporation, MODEL: FP-6500).

Preparation Example 1

Preparation of Ingredient Ink 1 (Blue Light-Emitting Color)

First, a blue light-emitting macromolecular material A was synthesized through polymerization by the Suzuki polymerization method. The obtained blue light-emitting macromolecular material A is a polymer composed of the constitutional unit a, the constitutional unit b, the constitutional unit c, the constitutional unit d, and the constitutional unit e represented by the following formulae at a molar ratio of constitutional unit a:constitutional unit b:constitutional unit c:constitutional unit d:constitutional unit e=50:32:10:3:5. The molar ratio was calculated based on a charging ratio. The polystyrene-equivalent weight average molecular weight was 229,000.

[Chemical Formula 5]

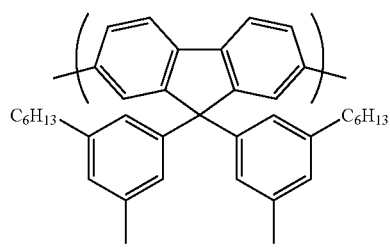
a

[Chemical Formula 6]

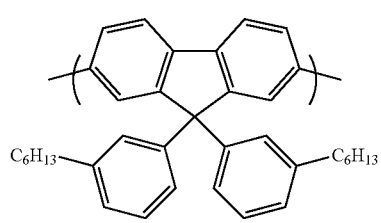
b

[Chemical Formula 7]

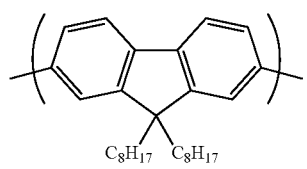
c

[Chemical Formula 8]

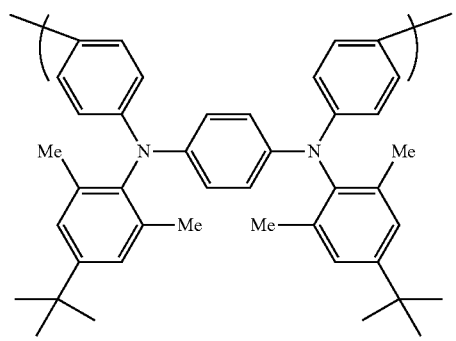
d

[Chemical Formula 9]

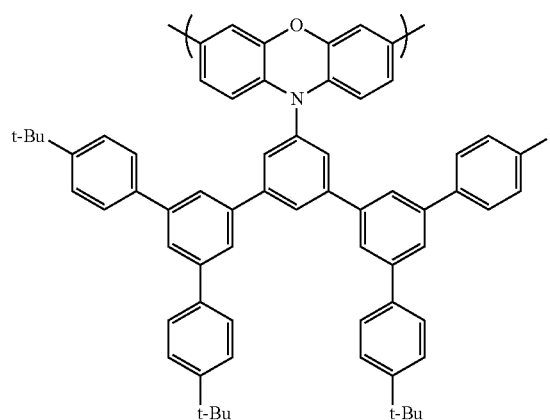
e

Next, the blue light-emitting macromolecular material A was dissolved in a mixed solvent of anisole and cyclohexylbenzene (a weight ratio of 1:1) to obtain an ingredient ink 1 having a solid content of 1.2% by weight. The ingredient ink 1 was used to form a thin film having a thickness of 60 nm. The peak wavelength of the thin film in an emission spectrum was 461 nm.

Preparation Example 2

Preparation of Ingredient Ink 2 (Green Light-Emitting Color)

First, a green light-emitting macromolecular material B was synthesized through polymerization by the Suzuki polymerization method. The obtained green light-emitting macromolecular material B is a polymer composed of the constitutional unit f, the constitutional unit c, the constitutional unit d, the constitutional unit g, and the constitutional unit h represented by the formulae at a molar ratio of constitutional unit f:constitutional unit c:constitutional unit d:constitutional unit g:constitutional unit h=80:10:5:3:2. The molar ratio was calculated based on a charging ratio. The polystyrene-equivalent weight average molecular weight was 202,000.

[Chemical Formula 10]

f (structure shown)

[Chemical Formula 11]

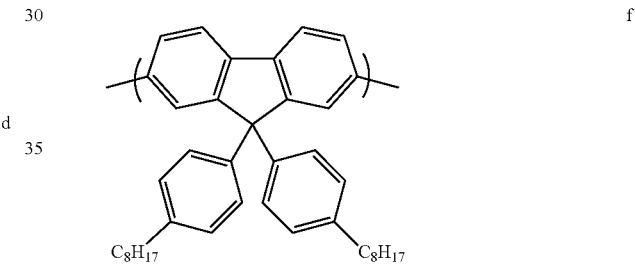
g

[Chemical Formula 12]

h (structure shown)

Next, the green light-emitting macromolecular material B was dissolved in a mixed solvent of anisole and cyclohexylbenzene (a weight ratio of 1:1) to obtain an ingredient ink 2 having a solid content of 1.2% by weight. The ingredient ink 2 was used to form a thin film having a thickness of 60 nm. The emission peak wavelength of the thin film in an emission spectrum was 527 nm.

Preparation Example 3

Preparation of Ingredient Ink 3 (Red Light-Emitting Color)

First, a blue light-emitting macromolecular material C was synthesized through polymerization by the Suzuki polymerization method. The obtained blue light-emitting macromolecular material C is a polymer composed of the constitutional unit f, the constitutional unit i, the constitutional unit c, and the constitutional unit d represented by the formulae at a molar ratio of constitutional unit f:constitutional unit i:constitutional unit c:constitutional unit d=50:32:15:5. The molar ratio was calculated based on a charging ratio. The polystyrene-equivalent weight average molecular weight was 257,000.

[Chemical Formula 13]

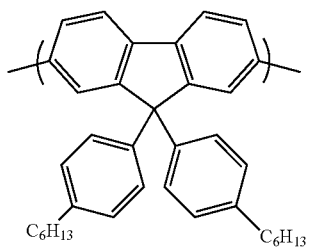

i

An ingredient ink containing the blue light-emitting macromolecular material C was used to form a thin film having a thickness of 60 nm by a spin coating method. The emission peak wavelength of the thin film in an emission spectrum was 452 nm.

Next, the blue light-emitting macromolecular material C and an iridium (Ir) complex D represented by Formula D were dissolved at a weight ratio of 92.5:7.5 in a mixed solvent of anisole and cyclohexylbenzene (a weight ratio of 1:1) to obtain an ingredient ink 3 having a solid content of 1.2% by weight. The ingredient ink 3 was used to form a thin film having a thickness of 60 nm. The emission peak wavelength of the thin film in an emission spectrum was 600 nm.

[Chemical Formula 14]

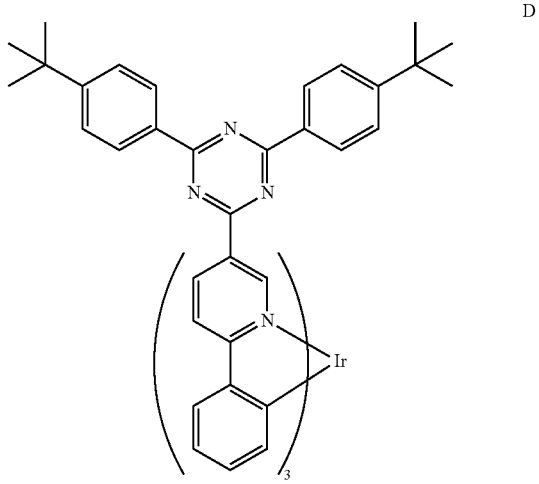

D

EXPLANATIONS OF LETTERS OR NUMERALS 10 coating system
20 ingredient ink supply portion
22a first ingredient ink tank
22b second ingredient ink tank
22c third ingredient ink tank
30 supply regulator portion
32 flow measurement portion
32a first sensor
32b second sensor
32c third sensor
34 regulator portion
34a first regulator valve
34b second regulator valve
34c third regulator valve
35 front valve
36 diaphragm metering pump
37 rear valve
50 stirring tank
52 ink stirring mechanism
60 washing portion
62 washing solution supply portion
64 inert gas supply portion
66 washing solution supply pipe
68 inert gas supply pipe
70 controller portion
72 input portion
74 processing portion
76 output portion
80 electric telecommunication line
90 pipe
90a first pipe
90b second pipe
90c third pipe
100 coating device
120 ink transport portion
130 ink discharge portion

The invention claimed is:
1. A coating system comprising:
an ingredient ink supply portion supplying ingredient inks used in a coating method, each of the ingredient inks being a coating liquid that contains a light-emitting material being an organic compound;
a first pipe connected to the ingredient ink supply portion;

a stifling tank comprising an ink stirring mechanism and connected to the ingredient ink supply portion through the first pipe
a supply regulator portion provided on the first pipe and regulating the respective amounts of the ingredient inks supplied to the stirring tank;
a controller portion connected to the supply regulator portion through an electric telecommunication line, determining a mixing ratio of the ingredient inks, and controlling operation of the supply regulator portion based on the mixing ratio; and
a coating device comprising an ink transport portion connected to the stirring tank through a second pipe and comprising an ink discharge portion connected to the ink transport portion through a third pipe, wherein the controller portion has functions of receiving request ink data,
receiving a standard ink data set and determining a mixing ratio of a plurality of ingredient inks based on the standard ink data set and the request ink data, wherein standard ink data constituting the standard ink data set are the correlation between a mixing ratio of the ingredient inks in terms of weight ratio and a chromaticity of the light-emitting color, and are selected in a manner that coordinates are distributed in a larger area in the chromaticity coordinates,
determining the amounts of the ingredient inks supplied to the stirring tank based on the determined mixing ratio,
determining operation of the supply regulator portion for supplying the respective ingredient inks in the determined amounts and outputting a setup signal for performing the operation from an output portion, and
the supply regulator portion supplying the respective ingredient inks in the determined amounts into the stirring tank based on the input setup signal,
stirring the supplied ingredient inks with the ink stirring mechanism provided in the stirring tank to prepare a mixed ink for coating, and
applying the prepared mixed ink onto an object, and wherein the controller portion, in the step of determining a mixing ratio of a plurality of the ingredient inks
comparing the standard ink data set comprising three or more standard ink data with the request ink data,
calculating distances between coordinates in chromaticity coordinates of the respective standard ink data and coordinates in chromaticity coordinates of the request ink data to obtain distance data set,
ranking the distance data set and the corresponding standard ink data set in ascending order of the distance based on the obtained distance data set,
obtaining an equation of a first straight line passing through first coordinates of the first place and second coordinates of the second place in the ranking,
determining a-th coordinates corresponding to an a-th place in ranking, the a-th place being highest except the first coordinates and the second coordinates in the standard ink data set, such that the coordinates of the request ink data are comprised in an area surrounded by straight lines passing through the first coordinates, the second coordinates, and the a-th coordinates, at the controller portion,
obtaining an equation of a second straight line passing through the a-th coordinates thus determined and the coordinates of the request ink data,
obtaining coordinates of an intersection point of the first straight line and the second straight line,
determining whether at least one of conditions (1) and (2) is satisfied,
(1) x-coordinate value of the a-th coordinates≥x-coordinate value of the request ink data≥x-coordinate value of the intersection point, and
(2) x-coordinate value of the a-th coordinates≤x-coordinate value of the request ink data≤x-coordinate value of the intersection point,
obtaining a first distance value from the firs coordinates to the coordinates of the intersection point and a second distance value from the second coordinates to the coordinates of the intersection point,
determining the mixing ratio of the ingredient inks at the intersection point based on the first distance value and the second distance value,
obtaining a third distance value from the a-th coordinates to the coordinates of the request ink data and a fourth distance value from the coordinates of the request ink data to the coordinates of the intersection point, and
determining the mixing ratio of the ingredient inks for the request ink data based on the third distance value and the fourth distance value.

2. The coating system according to claim 1, wherein the supply regulator portion comprises a flow measurement portion provided on the first pipe and connected to the controller portion through the electric telecommunication line and comprises a regulator portion provided on the first pipe and connected to the controller portion through the electric telecommunication line.

3. The coating system according to claim 1, wherein the supply regulator portion comprises a front valve provided on the first pipe and connected to the controller portion through the electric telecommunication line, a diaphragm metering pump provided on the first pipe and connected to the controller portion through the electric telecommunication line, and a rear valve connected to the controller portion through the electric telecommunication line.

4. The coating system according to claim 1, further comprising a washing portion that comprises a washing solution supply portion connected to the stirring tank through a washing solution supply pipe and comprises an inert gas supply portion connected to the stifling tank through an inert gas supply pipe.

5. The coating system according to claim 1, wherein a coating method performed by the coating device is a spin coating method, a slit die method, a spraying method, or a capillary coating method.

6. A method for manufacturing a light-emitting device using the coating system according to claim 1, the method comprising the steps of:
receiving request ink data at the controller portion;
receiving a standard ink data set and determining a mixing ratio of a plurality of ingredient inks based on the standard ink data set and the request ink data at the controller portion;
determining the amounts of the ingredient inks supplied to the stifling tank based on the determined mixing ratio at the controller portion;
determining operation of the supply regulator portion for supplying the respective ingredient inks in the determined amounts and outputting a setup signal for performing the operation from an output portion, at the controller portion;
supplying the respective ingredient inks in the determined amounts into the stifling tank based on the input setup signal at the supply regulator portion;

stirring the supplied ingredient inks with the ink stirring mechanism provided in the stirring tank to prepare a mixed ink for coating; and applying the prepared mixed ink onto an object, wherein the step of determining a mixing ratio of a plurality of the ingredient inks comprises:

comparing the standard ink data set comprising three or more standard ink data with the request ink data at the controller portion, wherein the standard ink data are the correlation between a mixing ratio of the ingredient inks in terms of weight ratio and a chromaticity of the light-emitting color, and are selected in a manner that coordinates are distributed in a larger area in the chromaticity coordinates;

calculating distances between coordinates in chromaticity coordinates of the respective standard ink data and coordinates in chromaticity coordinates of the request ink data to obtain distance data set at the controller portion;

ranking the distance data set and the corresponding standard ink data set in ascending order of the distance based on the obtained distance data set at the controller portion;

obtaining an equation of a first straight line passing through first coordinates of the first place and second coordinates of the second place in the ranking at the controller portion;

determining a-th coordinates corresponding to an a-th place in the ranking, the a-th place being highest except the first coordinates and the second coordinates in the standard ink data set, such that the coordinates of the request ink data are comprised in an area surrounded by straight lines passing through the first coordinates the second coordinates and the a-th-coordinates, at the controller portion;

obtaining an equation of a second straight line passing through the a-th coordinates thus determined and the coordinates of the request ink data at the controller portion;

obtaining coordinates of an intersection point of the first straight line and the second straight line at the controller portion;

determining whether at least one of conditions (1) and (2) is satisfied at the controller portion:

(1) x-coordinate value of the a-th coordinates≥x-coordinate value of the request ink data≥x-coordinate value of the intersection point, and (2) x-coordinate value of the a-th coordinates≤x-coordinate value of the request ink data≤x-coordinate value of the intersection point;

obtaining a first distance value from the first coordinates to the coordinates of the intersection point and a second distance value from the second coordinates to the coordinates of the intersection point the controller portion;

determining the mixing ratio of the ingredient inks at the intersection point based on the first distance value and the second distance value at the controller portion;

obtaining third distance value from the a-th coordinates to the coordinates of the request ink data and a fourth distance value from the coordinates of the request ink data to the coordinates of the intersection point at the controller portion; and determining the mixing ratio of the ingredient inks for the request ink data based on the third distance value and the fourth distance value at the controller portion.

7. The method for manufacturing a light-emitting device according to claim 6, wherein the step of applying the mixed ink onto the object is performed by a spin coating method, a slit die method, a spraying method, or a capillary coating method.

8. The method for manufacturing a light-emitting device according to claim 6, wherein a plurality of mixed inks are applied and a plurality of light-emitting devices having a plurality of light-emitting colors are continuously manufactured.

* * * * *